United States Patent [19]
Tavana et al.

[11] Patent Number: 5,883,525
[45] Date of Patent: Mar. 16, 1999

[54] FPGA ARCHITECTURE WITH REPEATABLE TITLES INCLUDING ROUTING MATRICES AND LOGIC MATRICES

[75] Inventors: Danesh Tavana, Mountain View; Wilson K. Yee, Tracy; Victor A. Holen, Saratoga, all of Calif.

[73] Assignee: Xilinx, Inc., San Jose, Calif.

[21] Appl. No.: 943,890

[22] Filed: Oct. 3, 1997

Related U.S. Application Data

[62] Division of Ser. No. 618,445, Mar. 19, 1996, Pat. No. 5,682,107, which is a continuation of Ser. No. 222,138, Apr. 1, 1994, abandoned.

[51] Int. Cl.[6] .......................... H03K 7/38; H03K 19/177
[52] U.S. Cl. ............................ 326/39; 326/40; 326/41
[58] Field of Search ........................ 326/39, 40, 41

[56] References Cited

U.S. PATENT DOCUMENTS

| | | |
|---|---|---|
| Re. 34,363 | 8/1993 | Freeman . |
| 4,124,899 | 11/1978 | Birkner et al. .......................... 364/716 |
| 4,642,487 | 2/1987 | Carter ....................................... 326/41 |
| 4,706,216 | 11/1987 | Carter ....................................... 365/94 |
| 4,750,155 | 6/1988 | Hsieh ..................................... 365/203 |
| 4,758,745 | 7/1988 | Elgamal et al. . |
| 4,758,985 | 7/1988 | Carter ....................................... 365/94 |
| 4,821,233 | 4/1989 | Hsieh ..................................... 365/203 |
| 4,870,302 | 9/1989 | Freeman . |
| 5,079,451 | 1/1992 | Gudge et al ............................... 326/41 |
| 5,122,685 | 6/1992 | Chan et al. ................................ 326/41 |
| 5,144,166 | 9/1992 | Camarota et al. ........................ 326/41 |
| 5,148,390 | 9/1992 | Hsieh ....................................... 365/95 |
| 5,157,618 | 10/1992 | Ravindra et al. ....................... 364/490 |
| 5,198,705 | 3/1993 | Galbraith et al . |
| 5,208,491 | 5/1993 | Ebeling et al. ........................... 326/41 |
| 5,241,224 | 8/1993 | Pederson et al. . |
| 5,243,238 | 9/1993 | Kean . |
| 5,258,668 | 11/1993 | Cliff . |
| 5,260,610 | 11/1993 | Pederson et al. . |
| 5,260,611 | 11/1993 | Cliff . |
| 5,260,881 | 11/1993 | Agrawal et al. ........................ 364/489 |
| 5,267,187 | 11/1993 | Hsieh ....................................... 364/784 |
| 5,280,202 | 1/1994 | Chan . |
| 5,313,119 | 5/1994 | Cooke et al. . |
| 5,319,255 | 6/1994 | Gaverick et al. . |
| 5,323,069 | 6/1994 | Smith, Jr. .................................. 326/47 |
| 5,333,279 | 7/1994 | Dunning .................................. 395/280 |
| 5,343,406 | 8/1994 | Freeman et al. ........................ 364/490 |
| 5,347,519 | 9/1994 | Cooke et al. .......................... 371/22.2 |

(List continued on next page.)

FOREIGN PATENT DOCUMENTS

| | | |
|---|---|---|
| 0461798A2 | 6/1991 | European Pat. Off. . |
| WO 93/05577 | 8/1992 | WIPO . |

OTHER PUBLICATIONS

Xilinx, Inc., The Programmable Logic Data Book, 1993, pp. 1–1 through 1–7; 2–1 through 2–42; 2–97 through 2–130; and 2–177 through 2–204, available from Xilinx, Inc., 2100 Logic Drive, San Jose, California 95124.

Xilinx Programmable Gate Array Data Book, 1989, pp. 6–30 through 6–44, available from Xilinx, Inc., 2100 Logic Drive, San Jose, California 95124.

Morales, Luis, "Boundary Scan in XC4000 Devices", XAPP 017.001, Oct. 1992, pp. 1–19.

Weste et al.; "Principles of CMOS VLSI: A Systems Approach"; copyright 1985 by AT&T Bell Laboratories, Inc. and Kamran Eshraghian; p. 56.

*Primary Examiner*—Michael Tokar
*Assistant Examiner*—Richard Roseen
*Attorney, Agent, or Firm*—Edel M. Young

[57] ABSTRACT

An FPGA architecture offers logic elements with direct connection to neighboring logic elements and indirect connection through a routing matrix. A logic element and a portion of the routing matrix are formed as part of a tile, and tiles are joined to form arrays of selectable size. The routing matrix includes routing lines which connect just from one tile to the next and routing lines which extend longer distances through several tiles or through the entire chip. This combination is achieved by the formation of individual tiles, all of which are identical.

5 Claims, 26 Drawing Sheets

U.S. PATENT DOCUMENTS

| | | | |
|---|---|---|---|
| 5,349,250 | 9/1994 | New. | |
| 5,455,525 | 10/1995 | Ho et al. | 326/41 |
| 5,457,410 | 10/1995 | Ting | 326/39 |
| 5,500,609 | 3/1996 | Kean | 326/41 |
| 5,546,596 | 8/1996 | Geist | 326/41 |
| 5,610,536 | 3/1997 | Diba et al. | 326/40 |

CONFIGURABLE LOGIC BLOCK MATRIX

CLB IN DETAIL

TBUF IN DETAIL

OBUF IN DETAIL

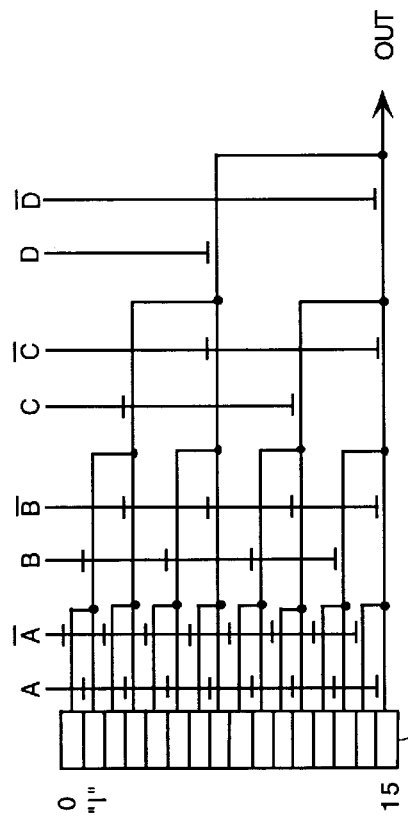
Fig. 4E Prior Art
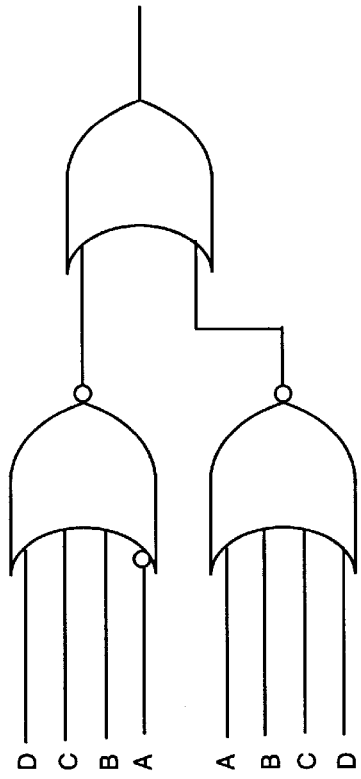
Fig. 4G Prior Art
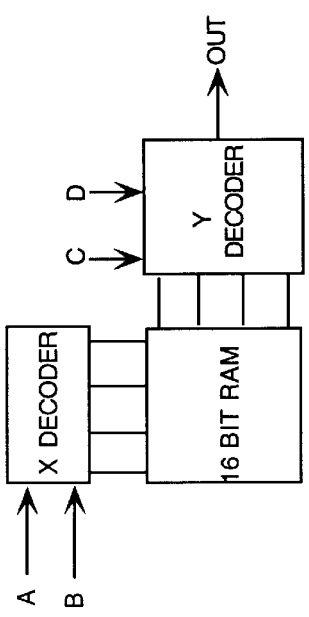
Fig. 4D Prior Art
Fig. 4F Prior Art

CARRY CHAIN

CASCADABLE DECODE

ROUTING MATRIX MODEL

ANOTHER ROUTING MATRIX MODEL

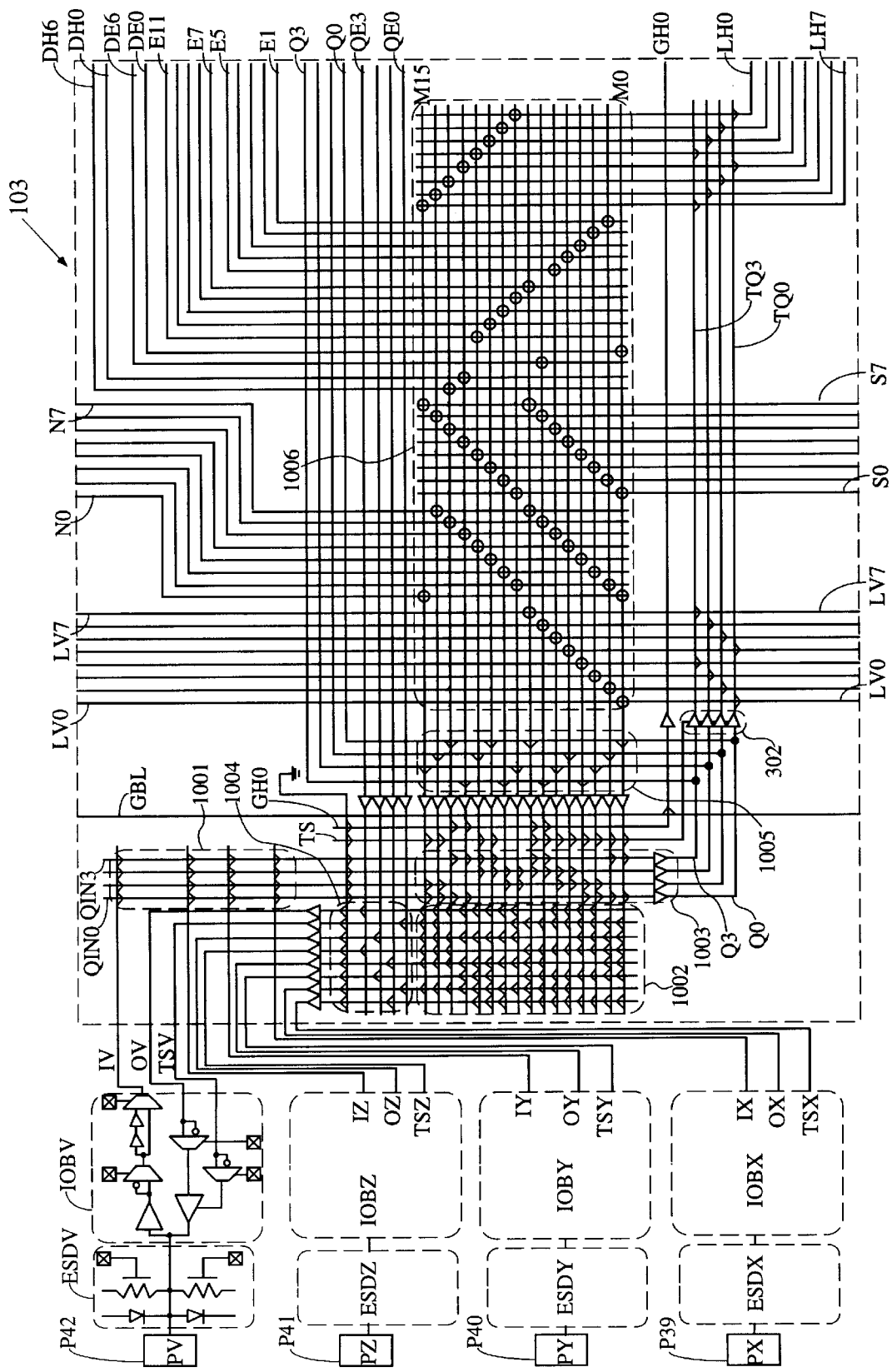
Fig. 10A  LEFT EDGE TILE AND PADS

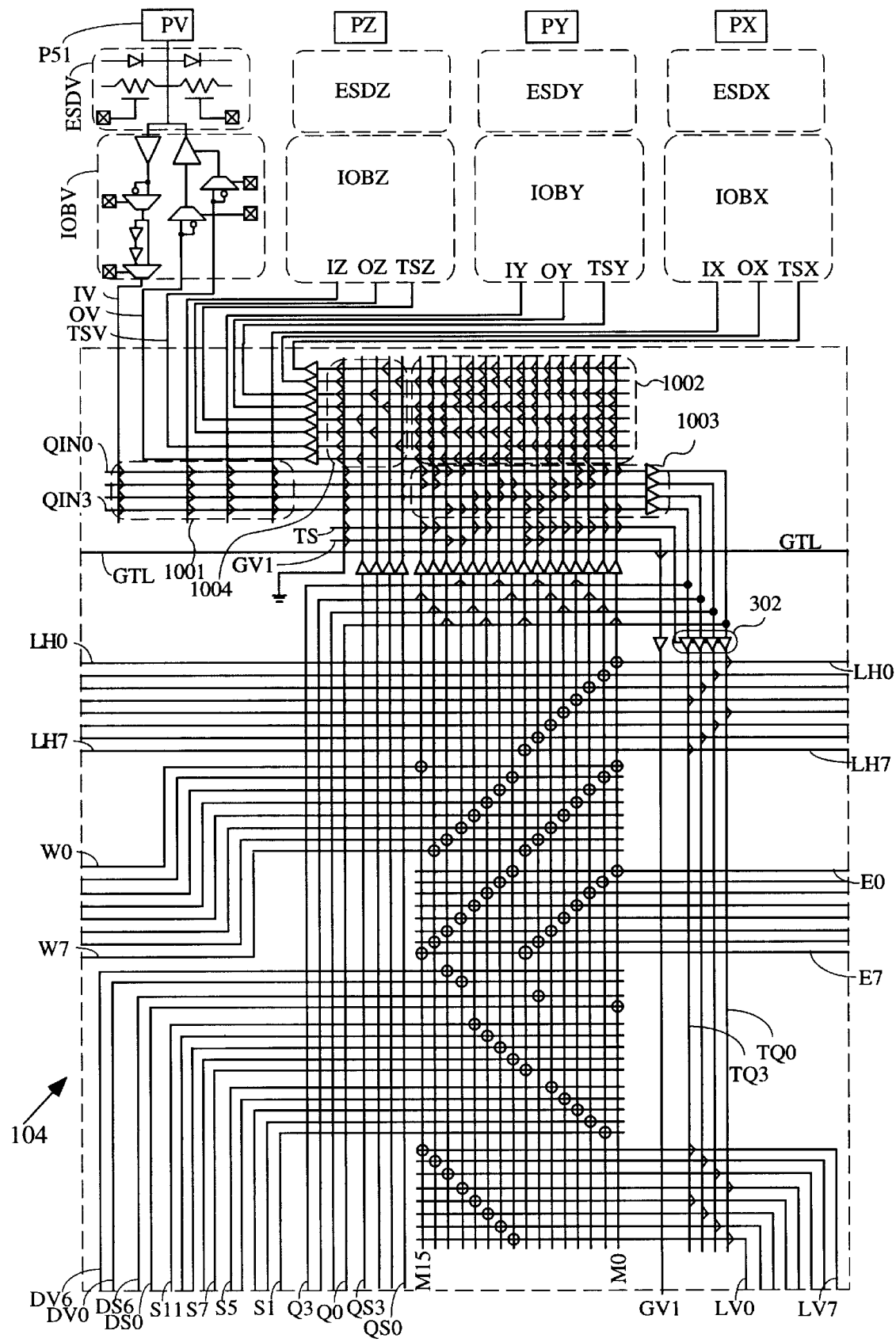
Fig. 10B TOP EDGE TILE AND PADS

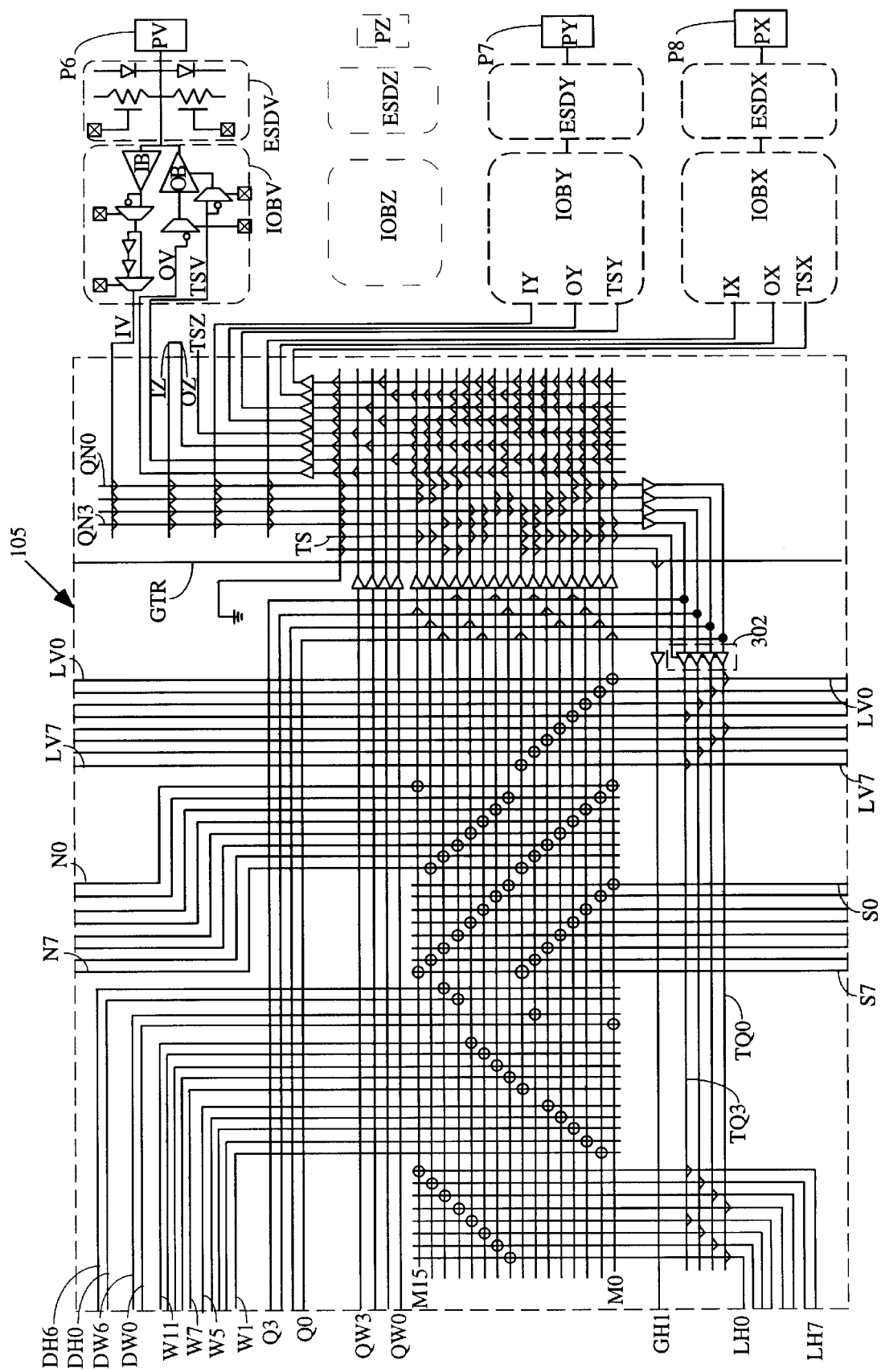
Fig. 10C RIGHT EDGE TILE AND PADS

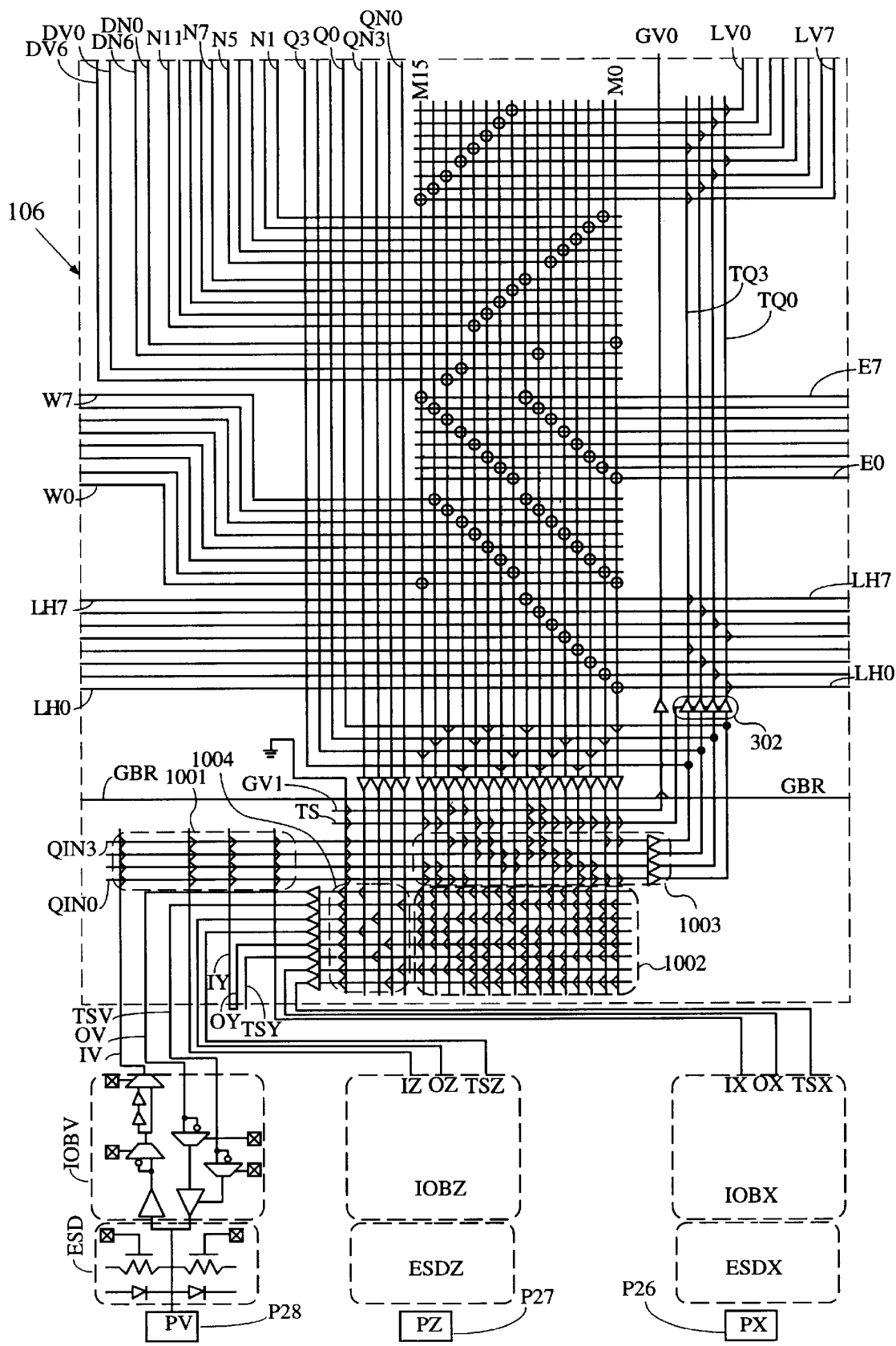
Fig. 10D BOTTOM EDGE TILE AND PADS

000# FPGA ARCHITECTURE WITH REPEATABLE TITLES INCLUDING ROUTING MATRICES AND LOGIC MATRICES

This application is a division of application Ser. No. 08/618,445, filed Mar. 19, 1996 U.S. Pat. No. 5,682,107 which is a continuation of application Ser. No. 08/222,138 filed Apr. 1, 1994 now abandoned.

CROSS-REFERENCE TO RELATED APPLICATIONS

This application relates to the following concurrently filed and commonly assigned co-pending U.S. patent applications:
1. Ser. No. 08/221,679 [docket M-2260-1N] invented by Danesh Tavana entitled "I/O INTERFACE CELL FOR USE WITH OPTIONAL PAD",
2. Ser. No. 08/223,391 [docket X-101] invented by Wilson K. Yee entitled "FIELD PROGRAMMABLE GATE ARRAY PROVIDING CONTENTION FREE CONFIGURATION AND RECONFIGURATION",
3. Ser. No. 08/223,083 [docket X-102] invented by Wilson K. Yee entitled "A PROGRMMABLE SCAN-CHAIN TESTING STRUCTURE AND METHOD",
4. Ser. No. 08/223,247 [docket X-103] invented by Lawrence C. Hung and Charles R. Erickson entitled "A PROGRAMMABLE LOGIC DEVICE INCLUDING A PARALLEL INPUT DEVICE FOR LOADING MEMORY CELLS",
5. Ser. No. 08/222,141[docket X-104] invented by Lawrence C. Hung entitled "A PROGRAMMABLE LOGIC DEVICE WITH PARTIALLY CONFIGURABLE MEMORY CELLS AND A METHOD FOR CONFIGURATION", and
6. Ser. No. 08/116,659[docket M-2565] invented by Bernard J. New entitled "LOGIC STRUCTURE AND CIRCUIT FOR FAST CARRY", all of which are incorporated herein by reference.

FIELD OF THE INVENTION

The invention relates to programmable logic devices formed in integrated circuits and more particularly to an architecture of a programmable logic device in which logic blocks are provided in a repeating pattern.

BACKGROUND OF THE INVENTION

Field programmable gate arrays (FPGAs) are well known in the art. An FPGA comprises an array of configurable logic blocks (CLBs) which are programmably interconnected to each other to provide a logic function desired by a user. U.S. Pat. No. 4,870,302, reissued as U.S. Pat. No. Re. 34,363, and incorporated herein by reference, describes a well known FPGA architecture. Other publications, such as U.S. Pat. No. 4,758,745, U.S. Pat. No. 5,243,238, and published application WO 93/05577, also incorporated herein by reference, describe other FPGA architectures. The Xilinx 1993 Data Book entitled "The Programmable Logic Data Book", available from Xilinx, Inc., 2100 Logic Drive, San Jose, Calif. 95124, also incorporated herein by reference, describes several products which implement a number of FPGA architectures.

An FPGA is considered to be a general purpose device, i.e. being capable of performing any one of a plurality of functions, and is programmed by an end user to perform a selected function. Because of this design flexibility, a general purpose FPGA includes a significant number of wiring lines and transistors which remain unused in most applications. Moreover, FPGAs include overhead devices which facilitate programing of the FPGA to do the specified function. These overhead devices undesirably add area to the FPGA chip. To compensate for this overhead, it is commercially important to reduce the cost of the FPGA. One way to reduce the cost is to make the FPGA less general purpose, that is, to eliminate some configuration options which are less commonly used. However, this reduction in configuration options reduces the value of the FPGA to customers, who may not be able to predict which options will be needed. Therefore, a need arises to eliminate area while maximizing configuration options.

SUMMARY OF THE INVENTION

In accordance with the present invention, a field programmable gate array (FPGA) architecture includes repeatable tiles. Each tile comprises a programmable routing matrix and a configurable logic block matrix. The configurable logic block matrix is programmably connectable to the programmable routing matrix, as well as to the configurable logic block matrices in adjacent tiles. The programmable routing matrix is programmably connectable to the programmable routing matrices adjacent to the tile, as well as to long lines which extend across the tile. Thus, each tile provides a combination of logic, connection to nearby tiles, and connection to a general routing structure. A plurality of these tiles are joined together to form an array of tiles which make up the functional portion of an FPGA chip. With this architecture, devices of different sizes are produced by simply joining together different numbers of tiles, thereby eliminating an expensive and time consuming design effort. Moreover, in accordance with the present invention, the programmable routing matrix and configurable logic block matrix minimize the number of programmable interconnection points (PIPs), thereby reducing expensive chip area and maximizing density of the entire chip. In further accordance with the present invention, proper positioning of the PIPs ensures the necessary routing flexibility, thereby maximizing functionality of the FPGA.

A tile architecture has a set of signal lines exiting the tile at the boundaries. Thus, for example, signal lines exiting at the right of one tile connect with signal lines exiting at the left of another tile. In one embodiment, adjacent tiles are identical, forming a repeating pattern. In another embodiment, adjacent tiles are not identical but have signal lines at least most of which match at the tile boundaries. Thus, a chip can be formed as an array of modular units which match at their boundaries, and additional flexibility of designing tiles for use in a plurality of chip designs is easily available

BRIEF DESCRIPTION OF THE DRAWINGS

FIG. 4D shows a look up table embodiment of the F, G, H and J function generators of FIG. 4A.

FIG. 4E shows another look up table embodiment of the F, G, H and J function generators of FIG. 4A.

FIG. 4F shows one Karnaugh map for the look up table function generator of FIG. 4D or 4E.

FIG. 4G shows one of the $2^{16}$ logic functions which can be implemented by the look up table function generator of FIG. 4D or 4E.

FIGS. 10A–10D illustrate, respectively, left, top, right, and bottom edge tiles according to one embodiment of the invention.

DETAILED DESCRIPTION OF THE DRAWINGS

Figure 1:
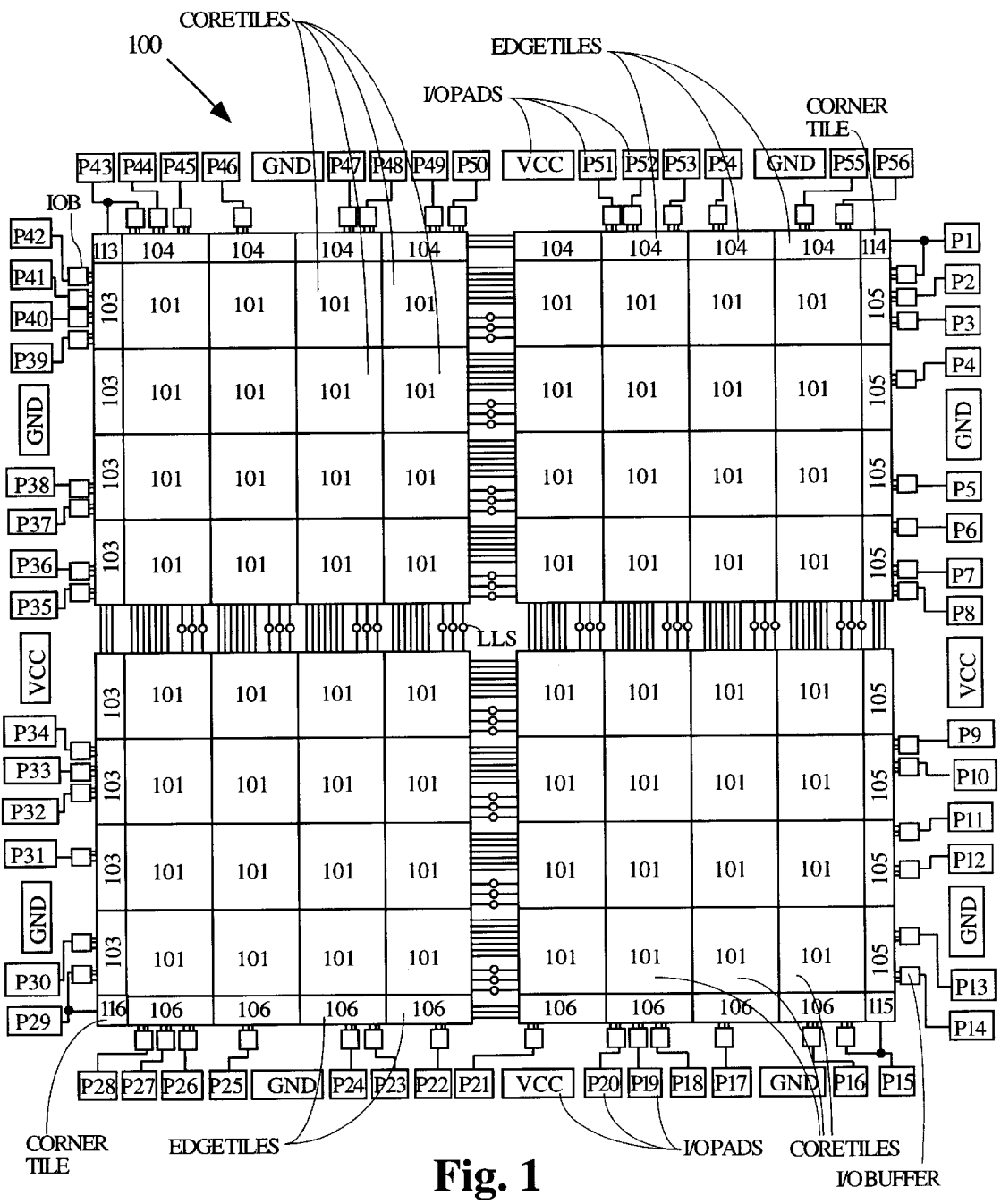
FIG. 1 shows an FPGA chip which includes components according to the present invention.

The following drawing conventions are used throughout the figures. A small solid black dot at the intersections of two lines indicates a permanent electrical connection between the crossing lines. An open circle enclosing an intersection between two lines indicates a programmable connection between the lines (for example, a pass transistor which is turned on to make the connection). Open circles represent bidirectional signal flow between the two lines. An open triangle at an intersection of two lines indicates a programmable connection with signal flow going onto the line pointed to by the apex of the triangle. (The signal is of course then present on the full length of the line. Thus, a triangle pointing in the opposite direction would have the same signal flow because the triangle points to the same wire.) In accordance with one embodiment of the present invention, programmable connections are provided by using programmable interconnection points (PIPs), wherein each PIP includes at least one transistor.

A triangle on a line which is not intersected by another line indicates a buffer which produces signal flow in the direction indicated by the apex of the triangle. Except for global lines ENOUT and ENLL (illustrated in FIG. 3A), a line which ends within the tile or matrix structure (i.e. does not extend to the border of a tile or matrix) is physically terminated within the tile. A line which extends to the border of the tile or matrix connects to a line on the next tile, which it contacts when two tiles are abutted together. Note that some lines which extend to an edge of a tile and thus into an adjacent tile change names at the tile boundary. Lines in the configurable logic block matrix and the programmable routing matrix are given the same reference numeral to indicate these lines are physically connected to each other.

FIG. 1 shows an FPGA chip 100 according to the present invention. In the center portion of chip 100 are a plurality of identical core tiles 101, which are interconnected by conductive lines (described in detail below). Along the four edges of chip 100 are west, north, east, and south edge tiles 103, 104, 105, 106, respectively. In the four corners of the chip are four corner tiles 113, 114, 115, and 116. Chip 100 includes pads, i.e. pads P1–P56, for connecting edge tiles 103, 104, 105, 106, and corner tiles 113–116 to external pins of a package (which holds chip 100). Note that each edge tile is further connected to a core tile 101. As shown in FIG. 1, edge tiles are connected to different numbers of pads P, typically from zero to four pads (explained in detail in reference to FIGS. 10a–10d). FIG. 1 also illustrates high voltage source pads VCC and low voltage source pads GND. Power and ground connections (not shown) are provided in a conventional manner throughout chip 100.

Figure 2A:
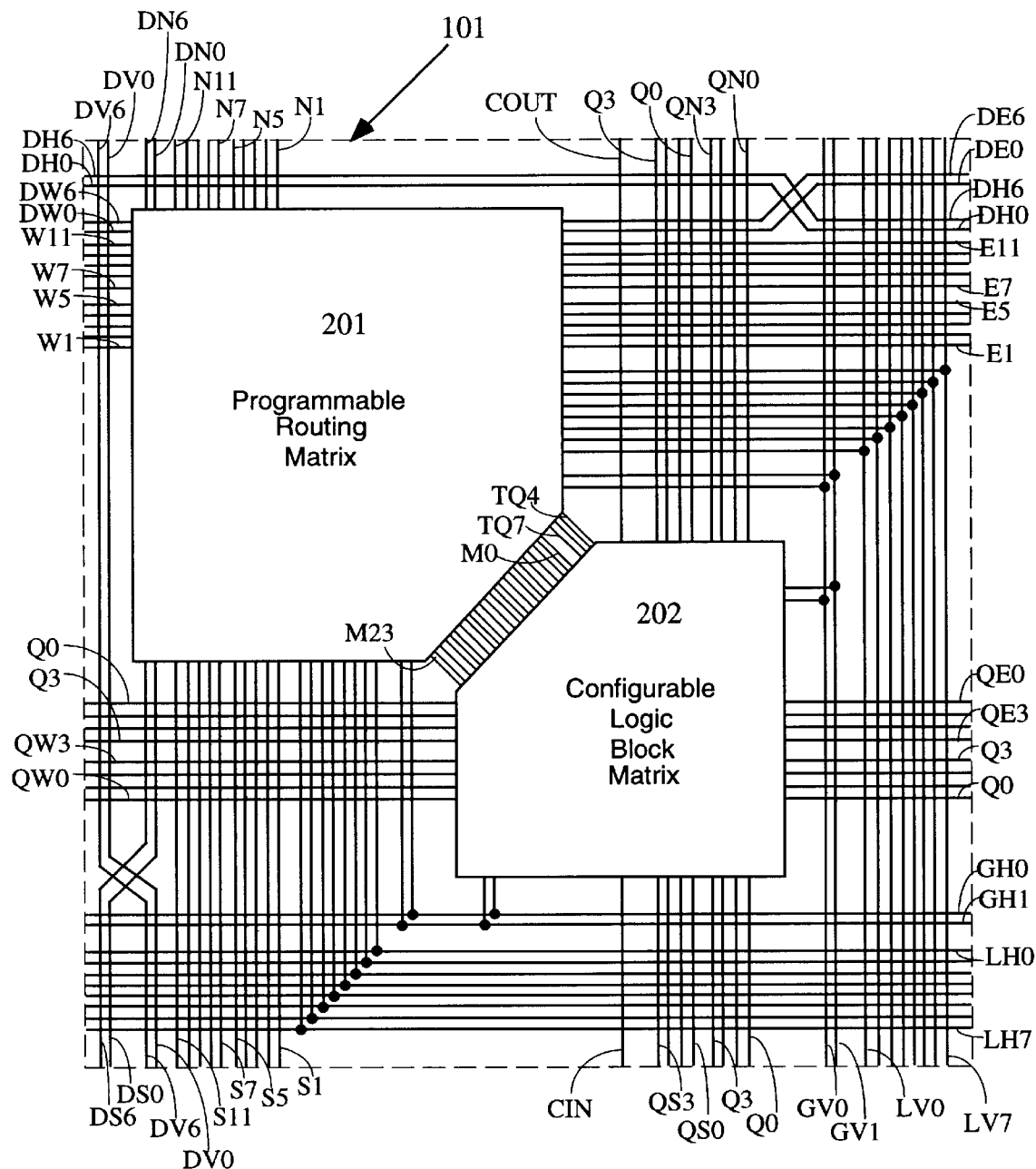
FIG. 2A shows a single core tile which populates a majority of the FPGA chip illustrated in FIG. 1.

FIG. 2A shows a core tile 101. Core tile 101 includes a programmable routing matrix 201 and a configurable logic block matrix 202. Programmable routing matrix 201 is described in detail in reference to FIG. 6, whereas configurable logic block matrix 201 is described in detail in reference to FIG. 3A.

Extending to the west from programmable routing matrix 201 are twelve lines with suffixes 0 through 11. These include single length west lines W1–W5, W7–W11, and double length west lines DW0 and DW6 (described in detail below). Extending to the north from programmable routing matrix 201 are single length north lines N1–N5, N7–N11 and double length north lines DN0 and DN6. Extending to the east are single length east lines E1–E5 and E7–E11 and double length east lines DE0 and DE6. Extending to the south are single length south lines S1–S5 and S7–S11 and double length south lines DS0 and DS6. Extending east to west across tile 101 are double length horizontal lines DH0 and DH6. Extending north to south across tile 101 are double length vertical lines DV0 and DV6.

Figure 2B:
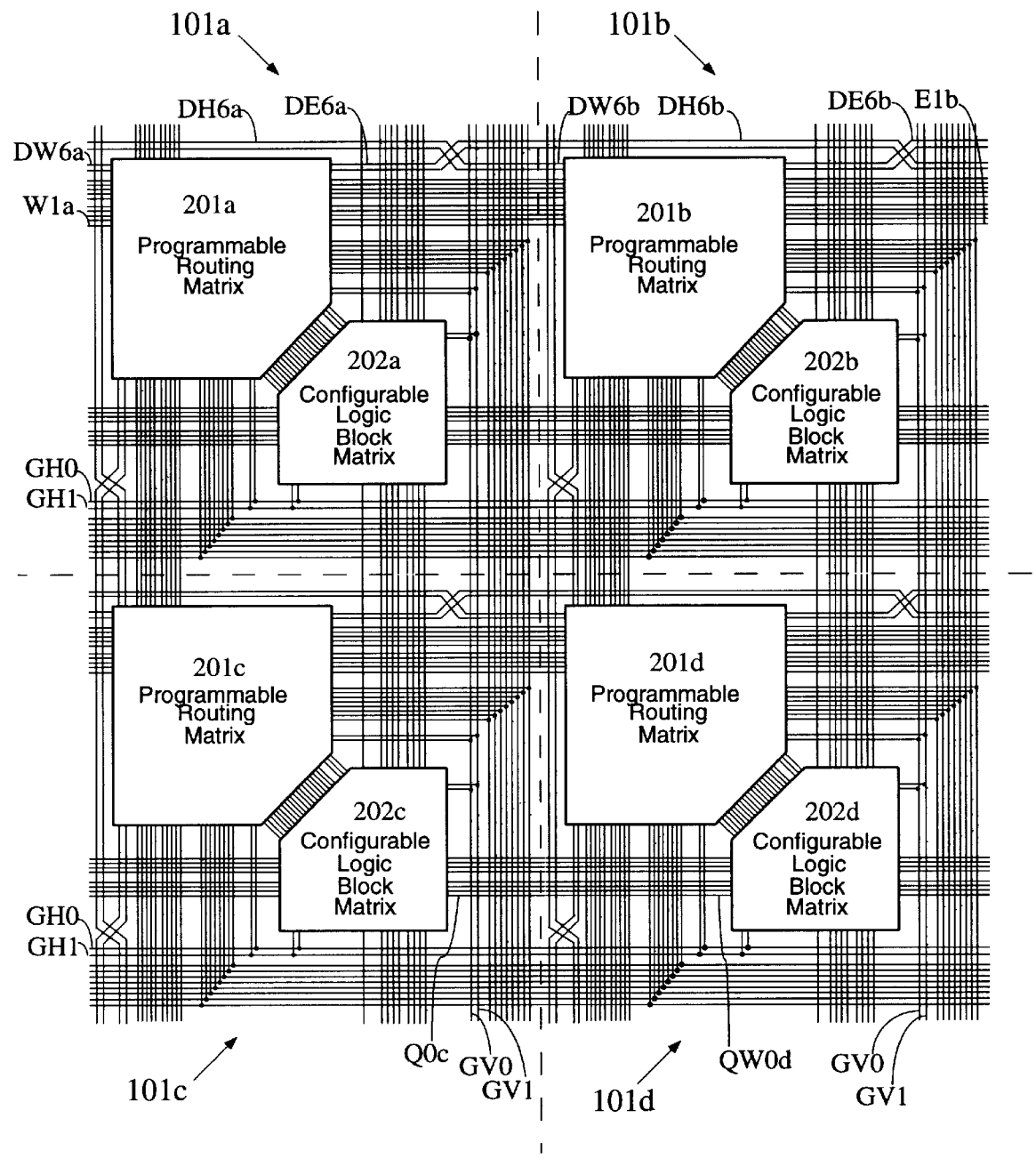
FIG. 2B shows four adjacent core tiles of the type illustrated in FIG. 2A.

FIG. 2B shows four adjacent core tiles 101a, 101b, 101c and 101d having a configuration identical to tile 101 illustrated in FIG. 2A. For clarity in FIG. 2B, most lines are not labeled. As mentioned previously, lines extending to the edges of tile 101 connect to lines in adjacent tiles. For example, single length west line W1b in tile 101b extending to the west from programmable routing matrix 201b connects to single length east line E1a in adjacent tile 101a. Double length horizontal line DH6a of tile 101a is coupled to double length west line DW6b of tile 101b, and is further coupled to a double length east line DE6 of a tile not shown in FIG. 2B but which is located directly west of tile 101a (hence the terminology "double length"). Line Q0c extending east from CLB matrix 202c in tile 101c connects to line QW0d extending west from CLB matrix 202d in tile 101d. FIG. 2B also illustrates that horizontal global lines GH0 and GH1 and vertical global lines GV0 and GV1 extend continuously from one tile 101 to the next. These global lines may be connected to a common line at the edge of the tile so that a signal on a global line such as GH0 extends through all tiles. As shown in FIG. 2B, vertical global lines GV0 and GV1 and horizontal global lines GH0 and GH1 are coupled to both programmable routing matrix 201 and configurable logic block matrix 202.

Returning to FIG. 2A, configurable logic block (CLB) matrix 202 is connected to the CLB matrix in the west tile (not shown) by output lines Q0–Q3 and input lines QW0–QW3, to the CLB matrix in the north tile (not shown) by output lines Q0–Q3 and input lines QN0–QN3, to the CLB matrix in the east by output lines Q0–Q3 and input lines QE0–QE3, and to the CLB matrix in the south tile (not shown) by output lines Q0–Q3 and input lines QS0–QS3. Note that output lines Q0–Q3 carry the same signals from CLB matrix 202 to adjacent tiles in four directions and thus have the same names. Carry-in line CIN and carry-out line COUT, which extend vertically in tile 101, connect to carry-out and carry-in lines, respectively, in adjacent tiles to form a fast carry path for arithmetic functions, as discussed in detail in copending U.S. patent application Ser. No. 08/116,659, "LOGIC STRUCTURE AND CIRCUIT FOR FAST CARRY" [docket No. M-2565], which is incorporated herein by reference.

Configurable Logic Block Matrix 202

Figure 3A:
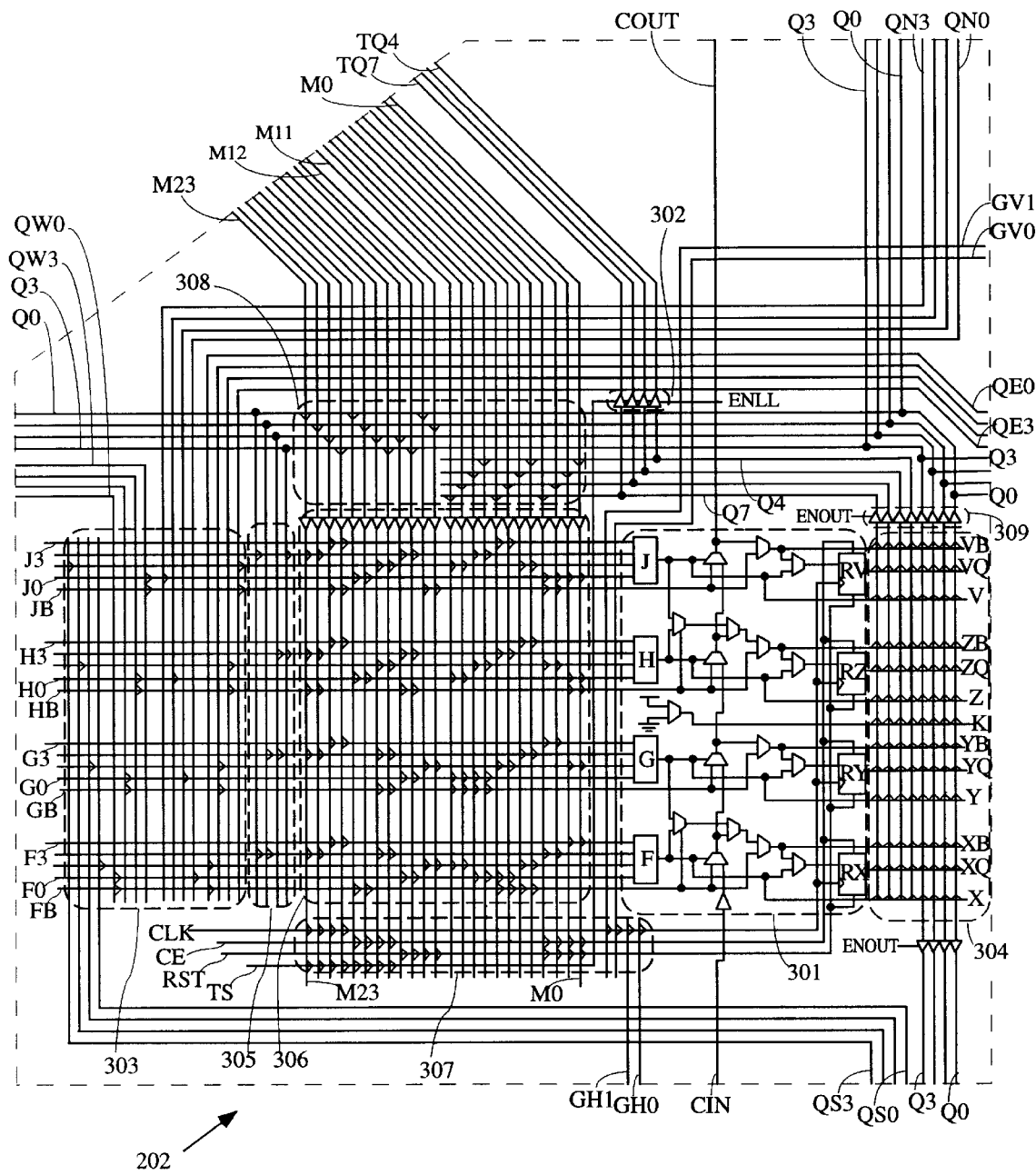
FIG. 3A illustrates a configurable logic block matrix which is part of the tile of FIG. 2A.

FIG. 3A illustrates configurable logic block (CLB) matrix 202 of FIG. 2a. CLB matrix 202 includes a CLB 301, a tristate buffer block 302, an input interconnect structure 303, a CLB output interconnect structure 304, a feedback interconnect structure 305, a general input interconnect structure 306, a register control interconnect structure 307, an output interconnect structure 308, and an output enable block 309.

Sparse Pipulation

Programmable connections are provided by using programmable interconnection points (PIPs), wherein each PIP includes at least one transistor. As is well known in the art, each transistor occupies valuable space on the chip substrate. Thus, in accordance with the present invention and referring to FIG. 3A, a majority of the horizontal and vertical lines in input interconnect structure 303, feedback interconnect structure 305, general input interconnect structure 306, and register control interconnect structure 307 are not programmably connectable. In other words, these structures are sparsely populated with PIPs, or are sparsely "pipulated". Sparse pipulation minimizes chip area used by PIPs, thereby maximizing density of the entire chip. In further accordance with the present invention, proper positioning of the PIPs significantly increases routing flexibility, thereby effectively compensating for the reduced number of PIPs in the interconnect structures.

For example, referring to input interconnect structure 303, PIPs are positioned to allow connection from each output line Q0–Q3 from CLB output interconnect structure 304 to one of the function generators F, G, H, or J of an adjacent tile in each of the four compass directions. In this embodiment, general input interconnect structure 306 provides four to six PIPs for each CLB input line (J0–J3, JB, H0–H3, HB, G0–G3, GB, F0–F3 and FB) to CLB 301. Feedback interconnect structure 305 provides direct connections from two of output lines Q0–Q3 to one of the function generator input terminals in CLB 301. As shown in FIG. 3A, 24 PIPs in output interconnect structure 308 connect output lines Q0–Q7 to tile interconnect lines M0–M23. In this manner, signals on tile interconnect lines M0–M23 are selectively transferred between CLB 301 and programmable routing matrix 201 (via CLB output interconnect structure 304, general input interconnect structure 306, and output interconnect structure 308). In this embodiment, less than one intersection in eight is provided with a PIP, thereby minimizing silicon area. Yet, connectivity from any output line to any input line is ensured by the PIPs provided.

Configurable Logic Block 301

Figure 4A:
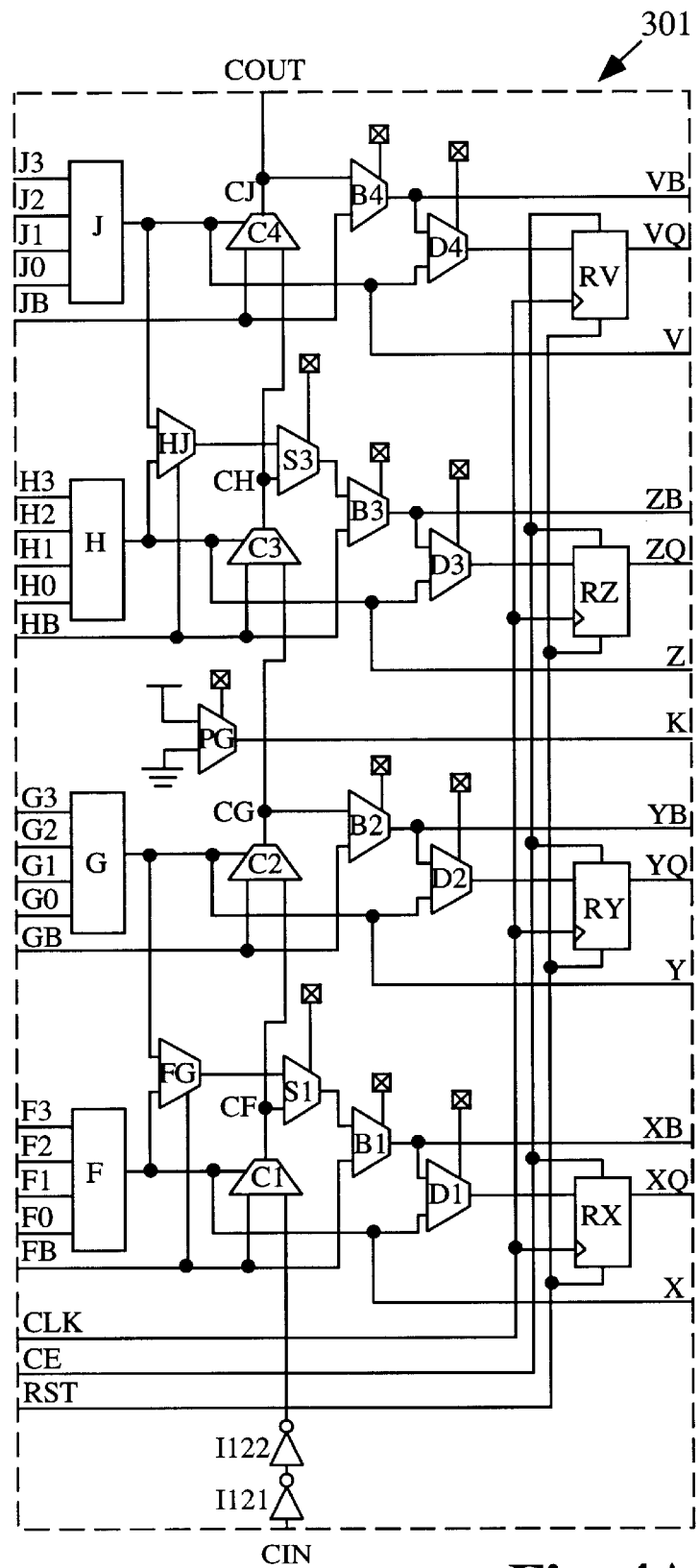
FIG. 4A illustrates the configurable logic block in the matrix of FIG. 3A.

A configurable logic block (CLB) 301 is illustrated in FIG. 4A. In this embodiment, CLB 301 includes four function generators F, G, H, and J, wherein each function generator comprises a 16-bit look up table that generates an output signal determined by the four input signals provided to the function generator and the values stored in the look up table. Thus, function generator F generates an output signal determined by the input signals provided on lines F0–F3, function generator G generates an output signal determined by the signals provided on CLB input lines G0–G3, function generator H generates an output signal determined by the signals provided on CLB input lines H0–H3, and function generator J generates an output signal determined by the signals provided on CLB input lines J0–J3.

Look Us Table

Operation of the look up table function generators will be described in connection with FIGS. 4D–4G. These figures were first discussed by Freeman in U.S. Pat. No. 4,870,302 now reissued as U.S. Pat. No. Re 34,363, incorporated herein by reference.

FIG. 4D illustrates a look up table, in this embodiment a 16-bit RAM, which provides an output signal in response to any one of sixteen possible combinations of four input signals. Specifically, input signals A and B control the X decoder to select any one of the four columns in the 16-bit RAM. In a similar manner, input signals C and D control the Y decoder to select any one of the four rows in the 16-bit RAM. The 16-bit RAM provides an output signal representative of the bit at the intersection of the selected row and the selected column. There are 16 such intersections and thus sixteen such bits. It logically follows that 16 bits provide $2^{16}$ possible combinations. Thus, if a 4-input NOR gate is to be simulated by the 16 bit RAM, the Karnaugh map for the look up table would be as shown in FIG. 4F. In FIG. 4F, all bits are "0" except the bit at the intersection of the first row (representing A=0, B=0) and the first column (representing C=0, D=0). If a logic "1" output signal is desired for A=1, B=0, C=0, D=0, then a logic "1" is stored at the intersection of the second row and the first column. If a logic "1" is desired for A=0, B=0, C=0, and D=0 and also for A=1, B=0, C=0 and D=0, then a logic "1" is stored at each of the intersections of the first column with the first row and the second row. The logic circuit represented by this loading of the look up table is shown in FIG. 4G. Thus, the look up table of FIG. 4D represents an elegant and simple implementation of any one of $2^{16}$ logic functions.

FIG. 4E shows a register configuration for yielding any one of sixteen select bits. Each of registers 0–15 in the vertical column to the left labeled "16 Select Bits", contains a selected signal, either a logic 1 or 0. By selecting the appropriate combination of signals A, B, C, and D and their complements, a particular bit stored in a particular one of the sixteen locations in the 16 Select Bits register is transmitted to the output lead OUT. Thus, for example, to transmit the bit in the "1" register to the output lead, the signal A, B, C, D is applied to the leads so labeled. To transmit the signal labeled "15" in the sixteenth location in the 16 Select Bits register to the output lead, the signal A, $\overline{B}$, $\overline{C}$, $\overline{D}$ is applied to the appropriate columns. Thus, this register configuration also provides any one of $2^{16}$ logic functions.

Referring back to FIG. 4A, the memory bits in look up tables F, G, H and J are typically loaded during configuration of the chip, for example through a shift register, or alternatively by an addressing means. In some embodiments, the memory bits are also loaded during operation of the chip, thereby reconfiguring the chip on the fly. A reconfigurable memory structure is discussed in commonly assigned, copending patent application Ser. No. 07/387,566 [docket no M-936] invented by Freeman et al and entitled "Distributed Memory Architecture for a Configurable Logic Array and Method for Using Distributed Memory", which is incorporated herein by reference.

Function generators F, G, H, and J provide output signals on CLB output lines X, Y, Z, and V, respectively. These output signals from function generators F, G, H, and J control multiplexers C1, C2, C3, and C4, thereby providing a cumulative carry-out function COUT. Multiplexer C1 receives a carry-in signal on line CIN and an input signal on line FB, and generates an output signal on line CF. Multiplexer C2 receives the signal on line CF and an input signal on line GB, and generates an output signal on line CG. Multiplexers C3 and C4 are connected in the same manner as Multiplexers C1 and C2. Multiplexer C4 provides an output signal on line COUT from CLB 301. For a detailed discussion of the implementation of arithmetic functions, see commonly assigned copending U.S. patent application Ser. No. 08/116,659 [docket number M-2565] invented by Bernard E. New, entitled "LOGIC STRUCTURE AND CIRCUIT FOR FAST CARRY", which is incorporated herein by reference.

In addition to function generators F, G, H, and J, each CLB 301 includes four storage devices RX, RY, RZ, and RV. These storage devices RX, RY, RZ, and RV each comprise flip flops with master and slave stages and an output multiplexer which takes outputs from the master and slave stages as inputs. Thus devices RX, RY, RZ, and RV can be configured by the multiplexer to serve as either flip flops or as latches.

Typically, periodic repowering of the carry signal is necessary. In this embodiment, to provide this repowering, a repowering buffer comprising inverters I121 and I122 is positioned every four multiplexers in the carry path, or once every CLB 301. In another embodiment, a repowering buffer is provided every two multiplexers in the carry path, thus two repowering buffers are provided in every CLB 301.

In this embodiment, CLB 301 includes five input lines per function generator. For example, referring to function generator F, CLB input lines F0–F3 provide input signals to function generator F, and a fifth CLB input line FB provides a multiplexer control input signal. Function generators G, H, and J are configured in a similar manner. Three input lines CLK, CE, and RST provide clock, clock enable, and reset signals, respectively, to registers RX, RY, RZ, and RV.

As shown in FIG. 4A, four groups of three output signals are provided from CLB 301, one group associated with each function generator. The three output signals include:

- a direct, unregistered output signal from the function generator (provided on CLB output lines X, Y, Z, or V),
- an alternative, unregistered output signal which may be derived from one of the CLB input signals, a signal from the carry chain, or in two cases a signal from a multiplexer which provides an output signal of a five-input function (provided on CLB output lines XB, YB, ZB, or VB), and
- a registered, output signal which may be loaded by the function generator or by one of the sources of the alternative output signal (provided on CLB output lines XQ, YQ, ZQ, or VQ).

For example, CLB output line X receives a direct unregistered output signal from function generator F. CLB output line XB receives either the signal on CLB input line FB or the output signal of multiplexer S1 (as determined by multiplexer B1), which in turn is derived from either the carry-out signal CF or the five-input function-generator output signal from multiplexer FG (see discussion of FIG. 5C below). CLB output line XQ receives the registered output signal from register RX, which derives its D input signal either directly from function generator F (the signal on output line X) or the alternative output signal on line XB as determined by multiplexer D1. Finally, output line K provides a constant signal, which may be high or low, as selected by multiplexer PG.

In the embodiment of FIG. 4A, multiplexers D1–D4 selectively provide either the output signals from function generators F, G, H, and J (the same signals on CLB output lines X–V) or the output signals from multiplexers B1–B4 to registers RX–RV, respectively. If multiplexers S1 and S3 are set to forward the carry signals of multiplexers C1 and C3, respectively, then multiplexers B1–B4 select between the input signals on CLB input lines FB–JB, respectively, and the output signals of multiplexers C1–C4.

Multiplexers C1–C4, in addition to being used for the carry function in an arithmetic operation, also generate wide AND and OR functions. To generate the AND function, a logic 0 is placed on line FB to program multiplexer C1 to generate an AND function of the F function generator output signal on CLB output line X and the carry-in signal on line CIN. Alternatively, to generate the OR function, a logic 1 is placed on CLB input line FB to program multiplexer C1 to generate an OR function of the complement of the output signal on CLB output line X and the carry-in signal on line CIN. With a truth table architecture, the OR function is achieved by loading the inverse values into the truth table. The function of multiplexers C1–C4 and their interaction with the logic block are further discussed in application Ser. No. 08/116,659 [M-2565] incorporated by reference.

Example Applications of CLB 301

Figure 5A:
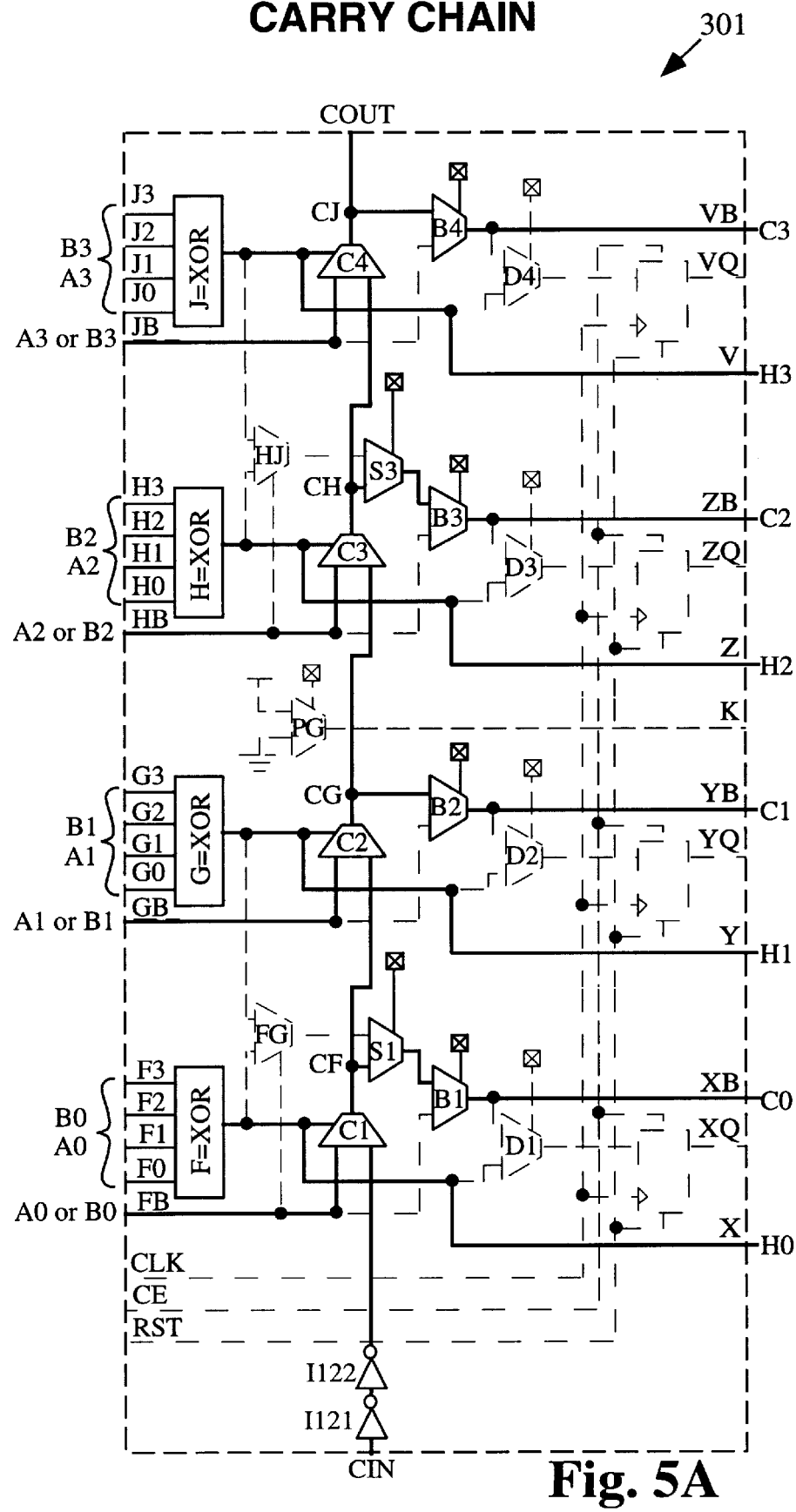
FIGS. 5A–5C illustrate application of the configurable logic block of FIG. 4A to form a carry chain, a cascadable decode circuit, and two 5-input combinational functions, respectively.
Figure 5B:
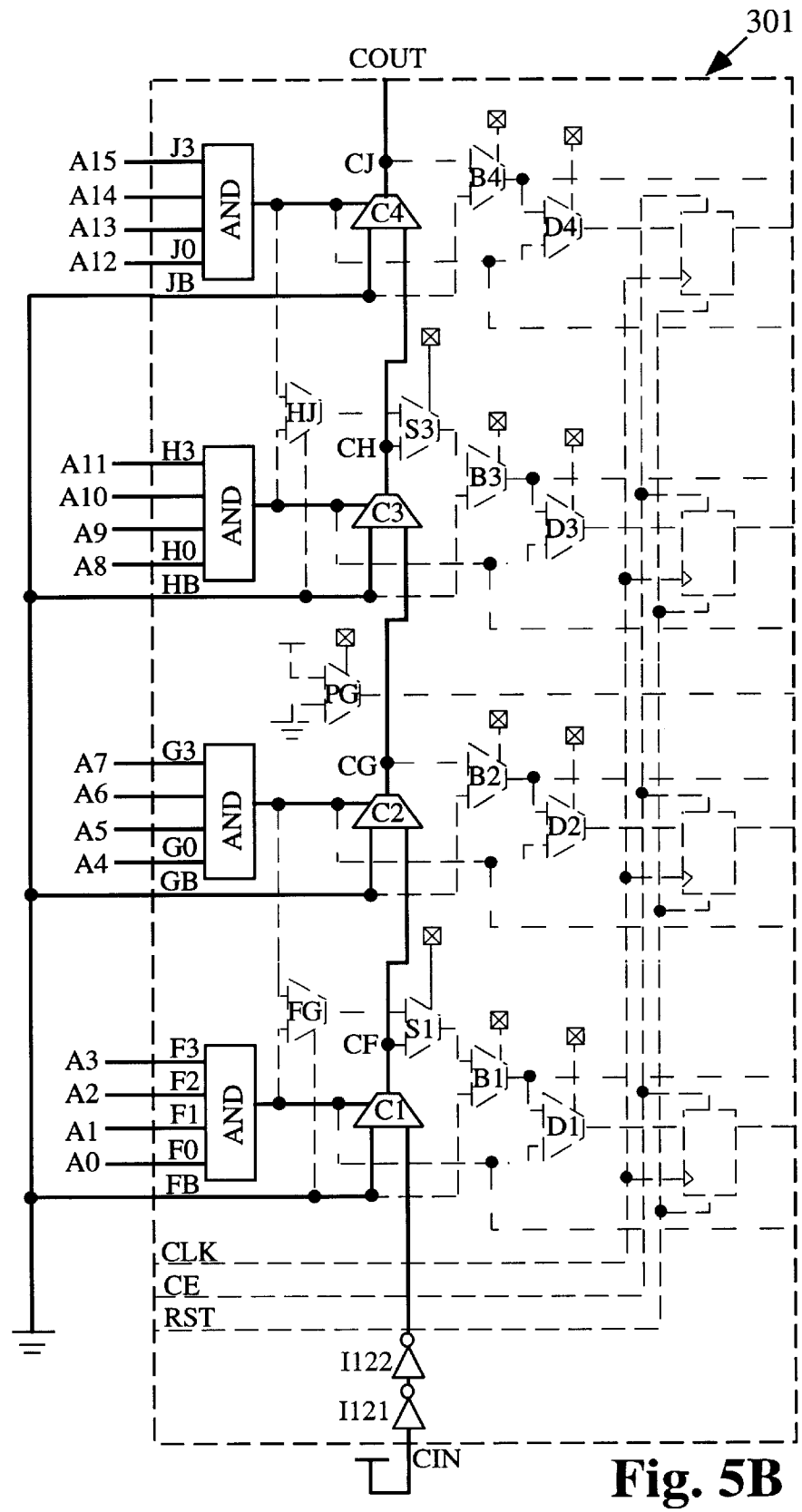
Figure 5C:
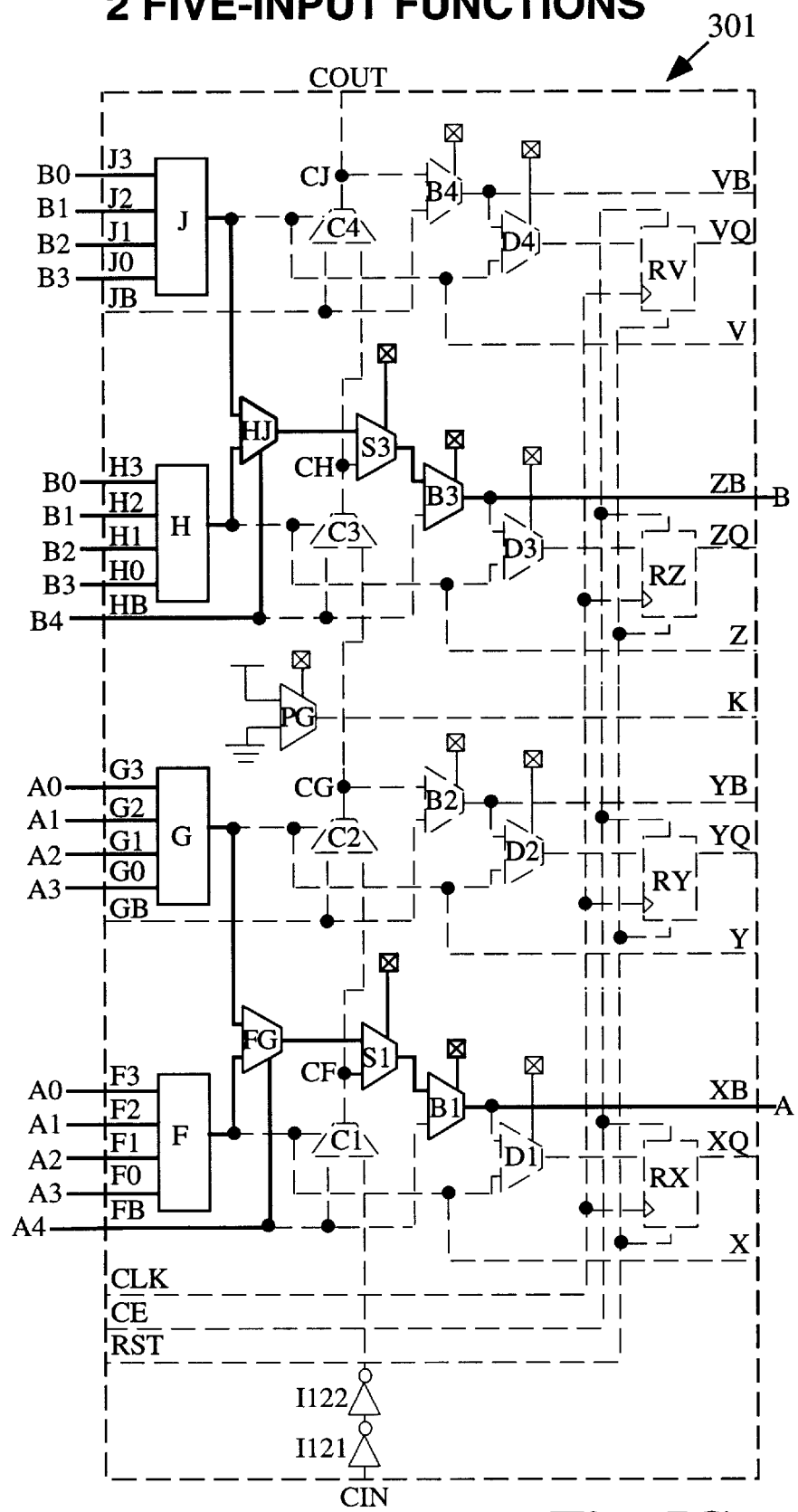

FIGS. 5A–5C illustrate applications using CLB 301 (described in detail in reference to FIG. 4A) to form a carry chain, a cascadable decode circuit and 2 five-input functions, respectively. These figures use heavy lines to illustrate lines of CLB 301 which are used for the particular selected function and thin dashed lines to indicate lines and elements not used for the particular function.

In FIG. 5A, CLB 301 is configured to compute a half sum H3H2H1H0 (where H3, H2, H1, and H0 are the four bits of a four-bit half-sum) and the carry bits C3C2C1C0 of two numbers A3A2A1A0 and B3B2B1B0. Another CLB (not shown), preferably positioned in the tile to the right or left of the one shown, will be used to complete the sum. Operands A3 and B3 are placed on any two of CLB input lines J0–J3. Operands A2 and B2 are placed on any two of CLB input lines H0–H3. A1 and B1 are placed on any two of CLB input lines G0–G3. A0 and B0 are placed on any two of CLB input lines F0–F3. Unused lines are either held high or held low. Each of function generators F, G, H, and J is loaded with the truth table of the XOR function (which is the half sum of its input signals). The truth table takes into account the values applied to unused input lines. If there are lower order bits than those applied to function generator F, the carry-out of those bits is placed on carry in line CIN. Multiplexers C1, C2, C3, and C4 are controlled by the output signals of function generators F, G, H and J, respectively. Specifically, if the function generator output signal is a logic 1 (signals A and B are not equal), the carrying value is forwarded to the carry-out of that bit, and if the function generator output signal is a logic 0 (signals A and B are equal), the value of signal A or signal B is forwarded to the carry-out of that bit. Multiplexers B1–B4, S1 and S3 are controlled to forward the carry-out of each bit to the "B" CLB output line (i.e. CLB output lines XB, YB, ZB, and VB) of that bit. The function generator output signal for each bit (on CLB output lines X, Y, Z, and V) is provided as the half sum output for that bit.

In another application shown in FIG. 5B, CLB 301 is configured to operate as a cascadable decoder. A 16-bit address represented by signals A0–A15, is placed on CLB input lines F0–F3, G0–G3, and J0–J3. CLB input lines FB, GB, HB, and JB are grounded. The 16 bits of each of function generators F, G, H, and J include a single logic 1 to reflect a portion of a predetermined address. A logic 1 signal is placed on carry in line CIN. If all four function generators F, G, H, and J output their respective logic 1s (i.e. indicating an address "match"), then multiplexers C1–C4 all forward a logic 1 and produce a logic 1 signal on carry out line COUT.

In yet another application shown in FIG. 5C, CLB 301 is configured to generate two functions of five input signals each. Function generators F and G generate a first function of five input signals on CLB output line XB and function generators H and J generate a second function of five input signals on CLB output line ZB. For the first function, four input signals A0–A3 are provided on the CLB input lines to both function generators F and G and the fifth input signal A4 is provided to line FB. Input signal A4 causes multiplexer FG to select the output signal of function generator F or function generator G. In this embodiment, multiplexer S1 is programmed by its memory cell to select the output signal of multiplexer FG, and multiplexer B1 is programmed by its memory cell to select the output signal of multiplexer S1. Thus, the five-input function output signal from function generators F and G is provided on CLB output line XB. In a similar manner, the function of the five input signals B0–B4 provided to function generators H and J is generated on CLB output line ZB.

Loading the appropriate truth tables into the two associated function generators F and G produces the desired function of five input signals. Specifically, in one embodiment, a 32-bit look up table is stored in function generators F and G (i.e. two 16-bit look up tables). Thus, a large number of functions are alternatively provided by loading different values into the memory cells which form the truth tables of the function generators and control multiplexers FG and HJ.

Tristate Buffer 302

Figure 4B:
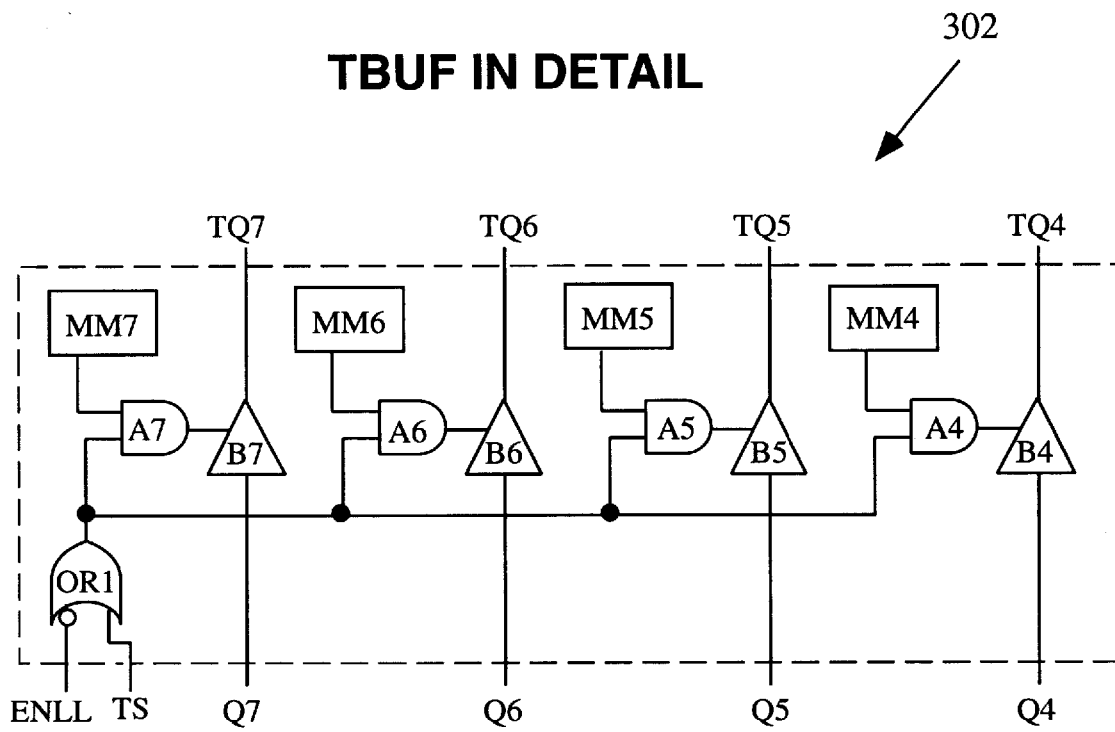
FIG. 4B illustrates tri-state buffer block 302 of FIG. 3A.

FIG. 4B illustrates a schematic drawing of tri-state buffer block 302 (FIG. 3A) which includes tristate buffers B4–B7. Note that the line names are identical to those referenced in FIG. 3A. Output signals from AND gates A4–A7 control tristate buffers B4–B7, respectively. If AND gate A5, for example, provides a logic 0 output signal, buffer B5 is enabled and provides a buffered output signal on line TQ5 which matches its corresponding input signal on line Q5. On the other hand, if AND gate A5 provides a logic 1 output signal, buffer B5 is disabled and provides a high impedance at the output terminal. The output signals provided by AND gates A4–A7 are determined either globally by the output signal from OR gate OR1 or individually by memory cells MM4–MM7, respectively. If memory cells MM4–MM7 store logic 0's, then the output signals of AND gates A4–A7 will also be logic 0's regardless of the signal from OR gate OR1. OR gate OR1 provides a high output signal if the ENLL signal is low or if the signal on line TS is high. Referring back to FIG. 3A, the signal on tristate line TS is programmably selected from any of tile interconnect lines M16–M23.

The ENLL signal is a global signal provided to all buffers 302 in all tiles 101. The ENLL signal is held low during configuration and as other signals are being enabled after configuration in order to prevent contention which could result if various TS lines which are to connect input signals to the same long line are switching unpredictably during configuration. Control and timing of the ENLL signal are discussed further in copending application Ser. No. 08/223,391 [docket X-101] which is incorporated by reference.

If buffers B4–B7 are to be used during operation as repowering buffers (always enabled) for placing a signal onto a long line, memory cells MM4–MM7 are loaded with low values during configuration. This means that during configuration, AND gates A4–A7 will enable buffers B4–B7. However, no contention occurs because the input signals Q4–Q7 which drive signals TQ4–TQ7 onto long lines all carry a common signal during configuration, as will now be discussed in connection with FIG. 4C.

Output Enable Block 309

Figure 4C:
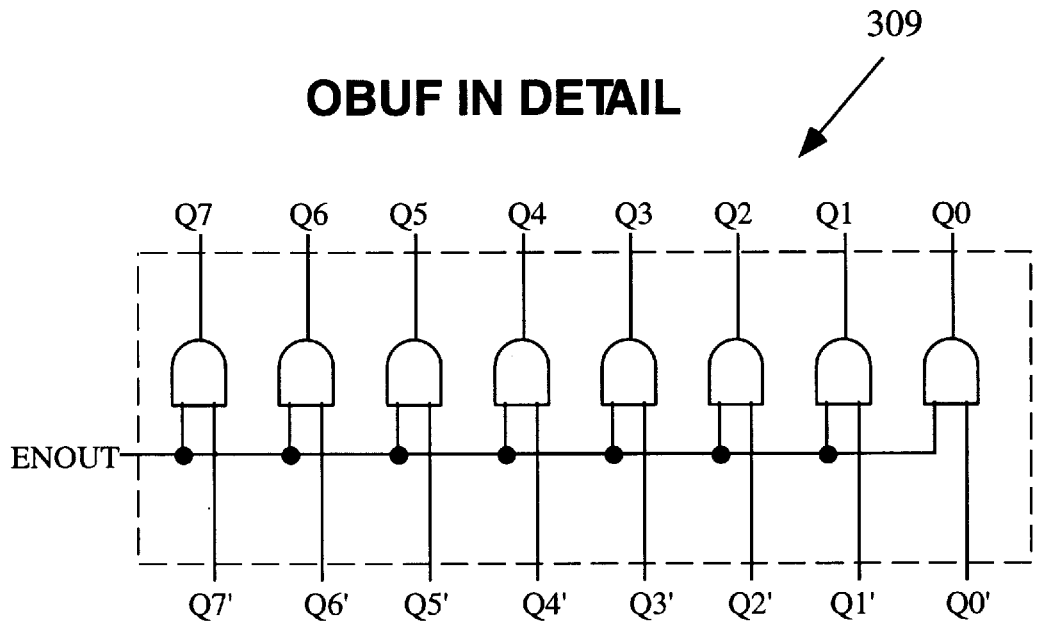
FIG. 4C illustrates the output enable block 309 of FIG. 3A.

The buffers in output enable block 309 are disabled during configuration of the device so that lines driven by these buffers will not experience contention. FIG. 4C illustrates the structure of block 309. Each buffer in output enable block 309 comprises a two-input AND gate. One input of each AND gate is driven by a global enable signal ENOUT. The other input is provided by a line Q0'–Q7' which is in turn provided by output signals from CLB 301 (FIG. 3A). During configuration, unexpected lines may be connected to these lines Q0–Q7. Therefore, to prevent contention, the ENOUT signal is held low during configuration so that all output signals on lines Q0–Q7 are low and unexpected connection of other lines does not produce contention because all signals have a low value. Generation and control of the ENOUT signal is discussed further in copending application Ser. No. 08/223,391 [docket X-101].

Neighbor Input Matrix 303

Referring back to FIG. 3A, in accordance with this embodiment of the present invention, adjacent CLBs 301 are not connected via direct connections, only via PIPs. For example, input signals are selectively provided to CLB 301 from input interconnect structure 303. Thus, each input line QS0–QS3 is connectable to one of the CLB input lines of one function generator. In this embodiment, line QS0 is connectable to CLB input line F1 of function generator F, line QS1 is connectable to CLB input line G1 of function generator G, line QS2 is connectable to CLB input line H1 of function generator H, and line QS3 is connectable to CLB input line J1 of function generator J. Because each function generator F, G, H or J is configurable to provide any function based on its input signals, a particular signal can be provided to any input terminal of a function generator and the look up table of that function generator loaded accordingly. Thus, it is not important which input signal is available to which function generator input terminal.

A signal on input line QW0 drives both CLB input lines F0 and FB. Similarly, a signal on input line QW1 drives CLB input lines G0 and GB, a signal on input line QW2 drives CLB input lines H0 and HB, and a signal on input line QW3 drives CLB input lines J0 and JB. Each signal on input lines QE0, QE1, QE2, and QE3 also drives two CLB input lines. Specifically, a signal on input line QE0 drives CLB input lines F1 and FB, a signal on input line QE1 drives lines G1 and GB, a signal on input line QE2 drives lines H1 and HB, and a signal on input line QE3 drives lines J1 and JB.

Signals on input lines QN0–QN3 and QS0–QS3 each drive only one CLB input line. Specifically, a signal on input line QN0 drives CLB input line F0, a signal on input line QN1 drives CLB input line G0, a signal on line QN2 drives CLB input line H0, and a signal on line QN3 drives CLB input line J0. A signal on input line QS0 drives CLB input line F1, a signal on input line QS1 drives CLB input line G1, a signal on input line QS2 drives CLB input line H1, and a signal on input line QS3 drives CLB input line J1. This embodiment is particularly desirable for horizontal flow of many signals because each input line QE0–QE3 and QW0–QW3 is programmably connected to two CLB input lines. Other embodiments of the present invention, having a different number and positioning of programmable connections, are optimized for a different signal flows.

Output Matrix 304

CLB 301 provides output-signals on CLB output lines X, XQ, XB, Y, YQ, YB, Z, ZQ, ZB, V, VQ, and VB. Note that CLB 301 also determines whether it provides the signal on carry out line COUT or whether the signal on carry in line CIN is transferred to the next CLB in the tile above. PIPs on CLB output lines X, XQ, XB, Y, YQ, YB, Z, ZQ, ZB, V, VQ, VB, and K are selectively programmed to drive any number of output lines Q0–Q7 through a CLB interconnect structure 304. Note that CLB interconnect structure 304 is fully pipulated (i.e., any of the 13 output signals of CLB 301, excluding the signal on carry out line COUT, can drive any of output lines Q0–Q7). Note that interconnect structure 304 also buffers its output signals for driving further lines. Full pipulation of interconnect structure 304 requires 108 (13×8) PIPs. In contrast, structures 303, 305, 306, and 307 in combination use 200 PIPs, even though they are sparsely pipulated. Flexibility of CLB 301 to access a particular input signal from tile interconnect lines M0–M23 is ensured by:

fully pipulating CLB output interconnect structure 304 so that any CLB output signal can be provided to any of tile interconnect lines M0–M23;

pipulating programmable routing matrix 201 so that each line M0–M23 is connected to at least one line M0–M23 in each adjacent routing matrix 201 (see discussion of FIG. 6 below);

pipulating CLB matrix 202 so that each output line of one CLB can be connected to at least one input line of each adjacent CLB; and forming function generators F, G, H, and J as look up tables, thereby allowing all input signals to each look up table to be interchangeable.

Moreover, except for five-input functions, function generators F, G, H, J are also interchangeable.

Thus, in accordance with the present invention, the above-described sparsely pipulated structures 303., 305, 306 and 307 significantly reduces chip area while maximizing flexibility.

Signals on output lines Q0–Q3 drive the input lines of CLBs in neighboring tiles. For example, by placing two core tiles 101 of FIG. 2A side by side, as in shown in FIG. 2B, output line Q0 on the left edge of core tile 101b connects to input line QE0 on the right edge of tile 101a. Other lines are correspondingly connected. Thus, referring to FIGS. 2A, 2B, and 3 in combination, CLB output line X (FIG. 3A) of CLB 301 in CLB matrix 202c (see FIG. 2B) is programmably connected to output line Q0c, which extends east (as well as other directions) from CLB matrix 202c in core tile 101c, which in turn is connected to input line QW0d of CLB matrix 202d in core tile 101d. PIPs are provided (as discussed above) for connecting input line QW0 to CLB input lines F0 and FB of CLB 301. Thus, in this manner, a path is established from the output lines of CLB 301 in CLB matrix 202c to the input lines of CLB 301 in CLB matrix 202d using only two PIPs, which in one embodiment includes two transistors.

Figure 3B:
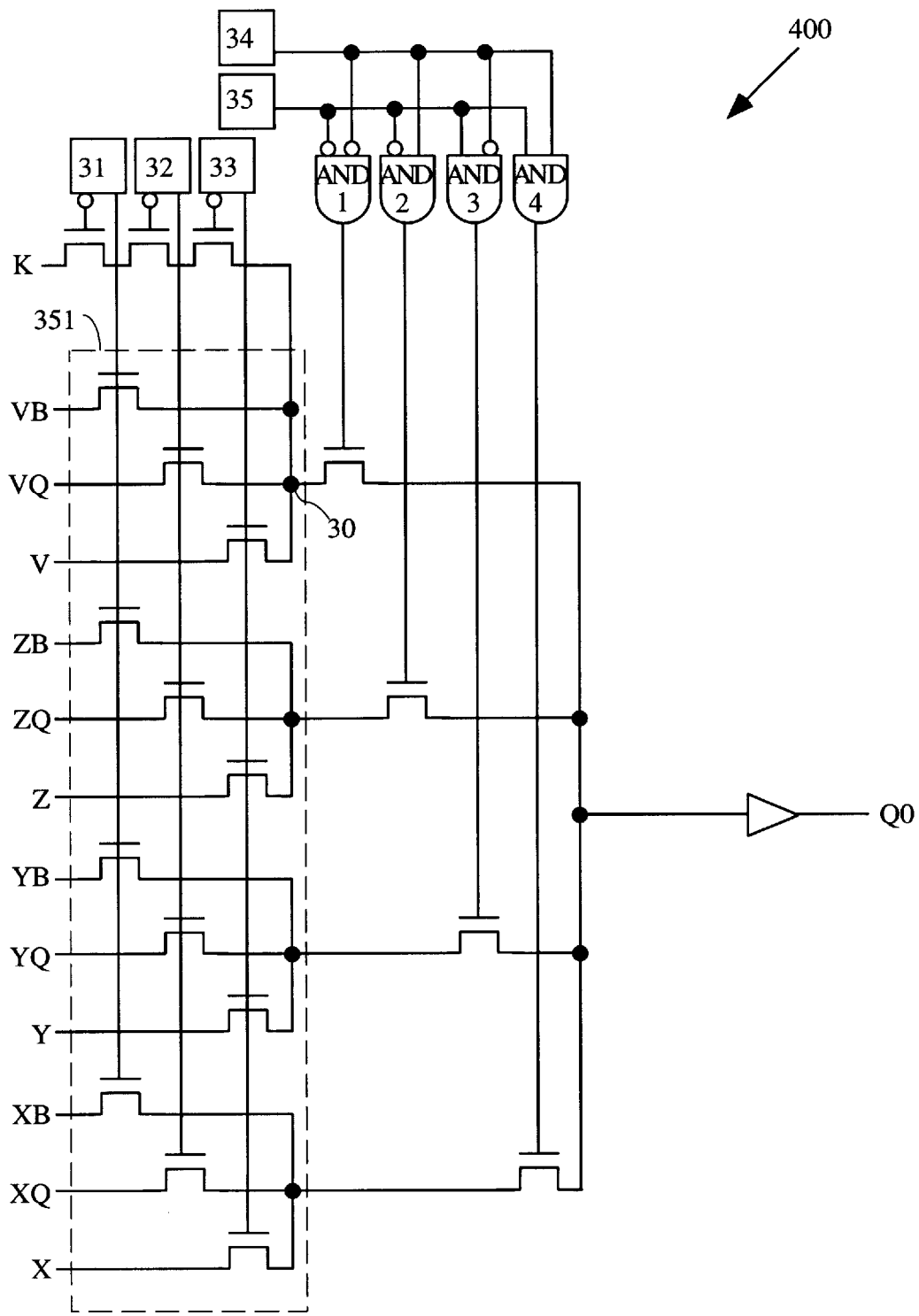
FIG. 3B illustrates a multiplexer structure which implements all PIPs which connect the output lines of a configurable logic block to one output line.
Figure 3C:
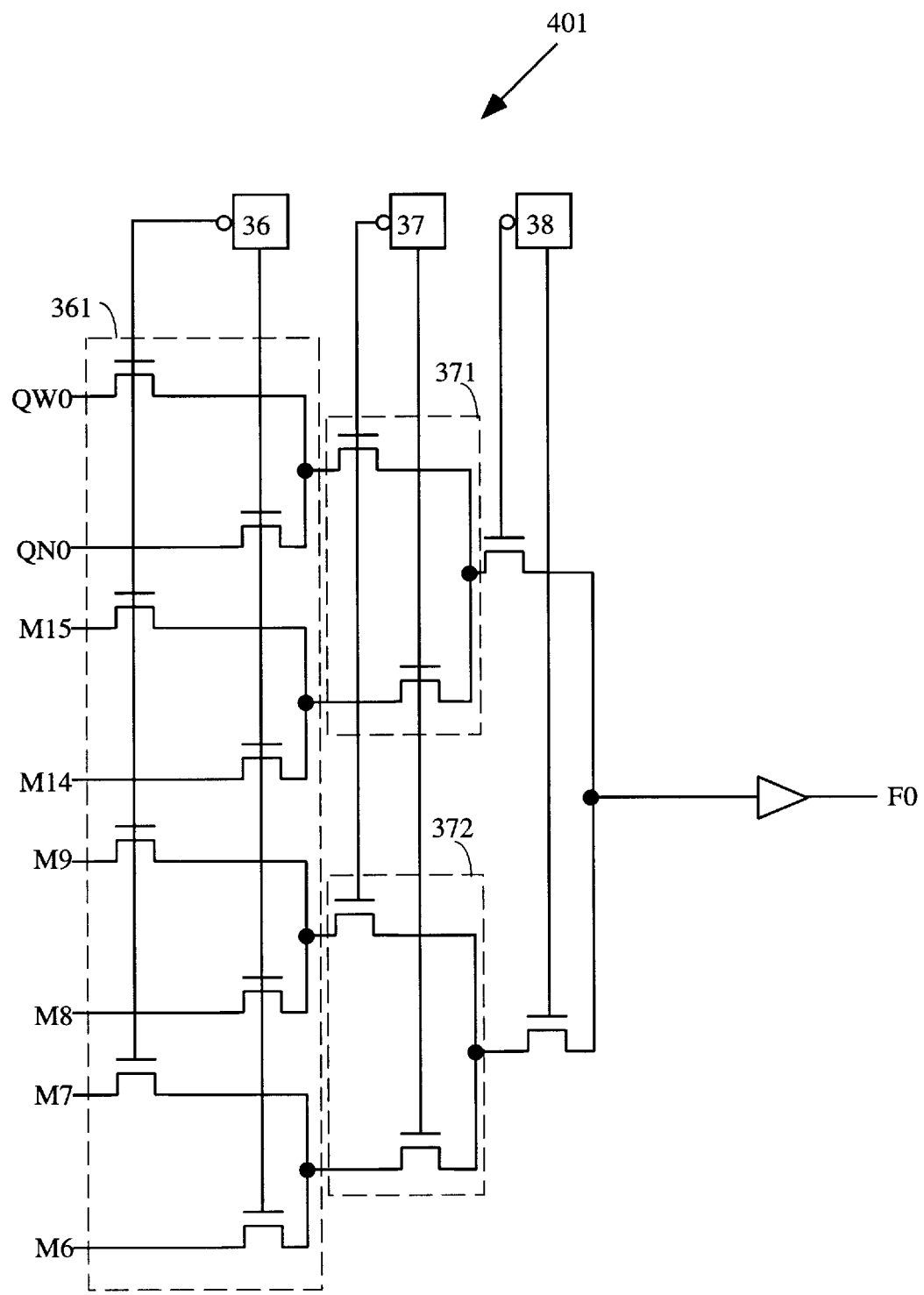
FIG. 3C shows one embodiment of a multiplexer structure which drives a configurable logic block input line.

In another embodiment, shown in FIG. 3B, a PIP in CLB output interconnect structure 304 requires a signal on a CLB output line to propagate through two transistors (note that signal K, a constant power or ground signal, propagates through four transistors). FIG. 3B illustrates a multiplexer structure 400 which implements all PIPs which connect the twelve CLB output lines (X, XQ, XB, Y, YQ, YB, Z, ZQ, ZB, V, VQ, VB) of CLB 301 and one power/ground output signal line K to output line Q0. Multiplexer structure 400 includes memory cells 31, 32, and 33 which control a first bank of twelve transistors 351 and select signal K if no transistor in bank 351 is selected. A logic 1 stored in one of memory cells 31, 32, and 33 selects one signal from each group of three signals in bank 351. If all memory cells 31, 32, and 33 store a logic 0, then signal K is provided to node 30. In a second stage, memory cells 34 and 35 control AND gates AND1–AND4 to select the output signal from one of output lines VQ, ZQ, YQ, and XQ and to provide the selected signal on output line Q0. If memory cells 31, 32, and 33 store a logic 0, thereby selecting signal K, then memory cells 34 and 35 must be programmed to provide the signal at node 30. Thus, thirteen PIPs are implemented using only 5 memory cells and sixteen transistors, each path requiring only two transistors for all signals except the constant value K, which travels a longer path. The signal on line K is not harmed by having a longer signal path since it is not a switching signal. A multiplexer structure 400, which selects one of thirteen output signals of CLB 301 to drive a predetermined output line, is provided for each of output lines Q0–Q7. Note that although it is possible for none of the thirteen output signals to drive an output line Q0–Q7, multiplexer structure 400 cannot select more than one of the thirteen output signals. In this manner, contention on output lines Q0–Q7 is avoided. In another embodiment of multiplexer structure 400, thirteen memory cells are provided, each memory cell controlling a single transistor. In this manner, each path requires only one transistor, thereby increasing signal speed. However, note that this embodiment increases silicon area.

Feedback Interconnect Structure 305

Referring back to FIG. 3A, feedback interconnect structure 305 selectively connects output lines Q0–Q3 to CLB input lines F2, G2, H2, and J2 within configurable logic block matrix 202. Thus, in this embodiment, any output signal from CLB 301 can be fed back to selected CLB input lines of any function generator F, G, H and J in CLB 301. Feedback interconnect structure 305 provides a PIP pattern that supports a counter (a counter feeds back its own signal) or a shift register (a shift register requires its neighbor's signal). The above-described PIP pattern prevents contention between signals on CLB input lines F2, G2, H2 and J2 and signals on CLB input lines F0, G0, H0, J0, F1, G1, H1, and J1 which are provided on other input lines to CLB matrix 202, such as input lines QW0 and QN3. Other embodiments of the present invention provide different combinations of PIPs in feedback interconnect structure 305.

General Input Matrix 306

General input matrix 306 receives input signals on tile interconnect lines M0–M23 and includes PIPs for placing these input signals onto CLB input lines F0–F3, FB, G0–G3, GB, H0–H3, HB, J0–J3, and JB. Optionally, a PIP pattern allows a signal on any tile interconnect line M0–M23 in general input interconnect structure 306 to drive one input line of each function generator F, G, H, and J. Because function generator input signals are interchangeable, (Lookup table inputs are interchangeable.) no tile interconnect line M0–M23 need be coupled to more that one input line of a function generator. In this embodiment of general input interconnect structure 306, PIPs are provided so that each CLB input line FB, GB, HB, and JB is driven by a signal on one of six tile interconnect lines M0–M23.

As another criterion in this embodiment, no CLB input line includes more than eight PIPs. Thus, referring to FIG. 3C, a multiplexer structure 401, using only three memory cells 36, 37 and 38, selects one of eight possible signals to control a first bank of transistors 361. Specifically, memory cell 38 selects one each of the paired signals on input lines QW0 or QN0, M15 or M14, M9 or M8, and M7 or M6. Memory cells 36 and 37 provide signals to the input terminals of AND gates AND5–AND8, which in turn control a second bank of transistors 362 to select a single signal to place on CLB input line F0.

In this embodiment of the present invention, the pattern of PIPs also provides a function of five inputs (discussed above in connection with FIG. 5C). For example, a signal on tile interconnect line M18 or M19 drives input line FB, a signal on tile interconnect line M14 or M15 drives lines F0 and G0, a signal on tile interconnect line M12 or M13 drives lines F1 and G1, a signal on tile interconnect line M16 or M17 drives input lines F2 and G2 and a signal on tile interconnect line M20 or M21 drives input lines F3 and G3. In this configuration, five-input functions are easily implemented with the PIP pattern provided.

Figure 6:
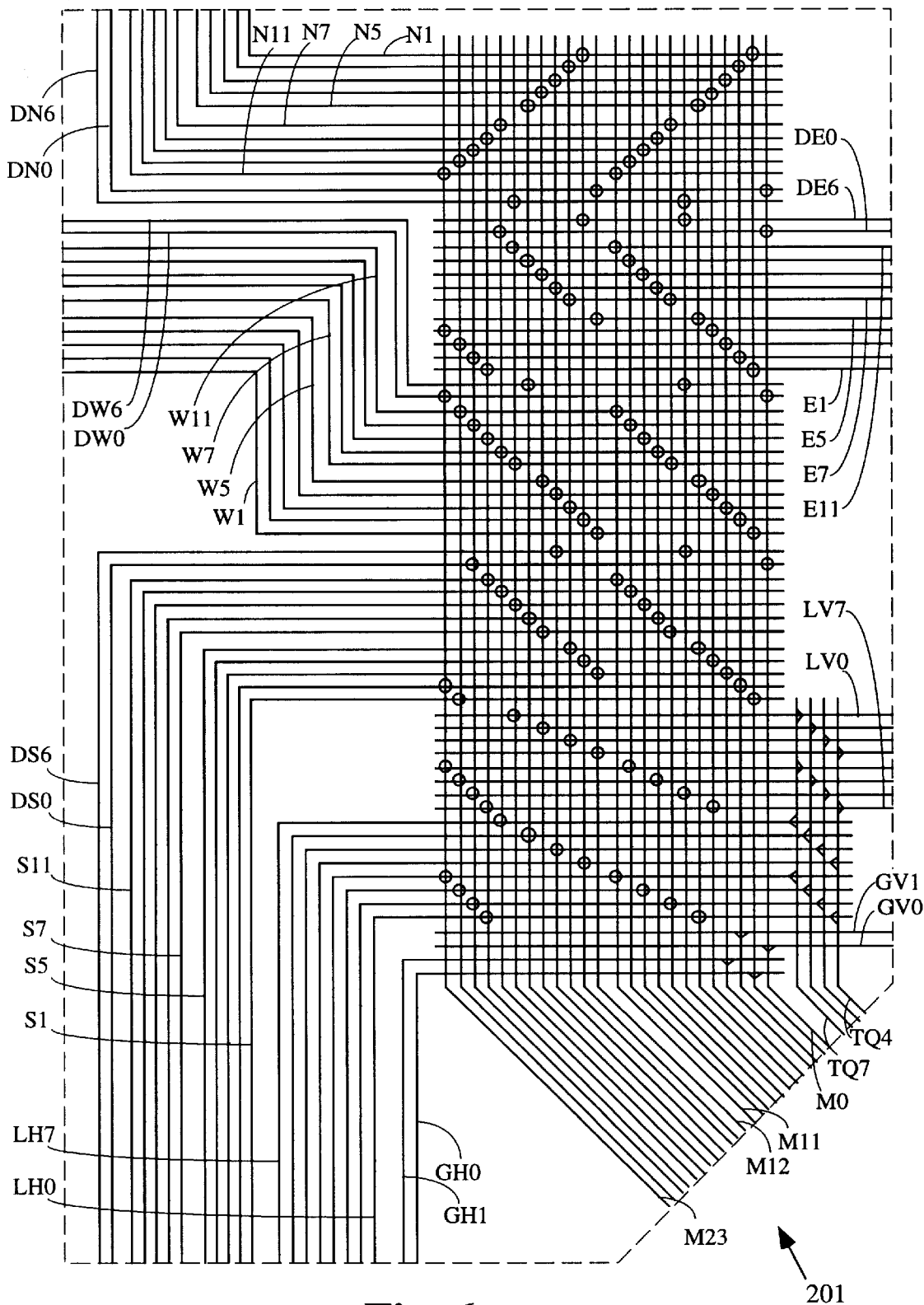
FIG. 6 illustrates the programmable routing matrix of FIG. 2A.

In further accordance with the present invention, and referring to FIGS. 3A and 6, PIPs allow connection from long horizontal lines LH0–LH7 and long vertical lines LV0–LV7, as well as global (horizontal and vertical) lines GH0, GH1, GV0, and GV1 to registers RV, RZ, RY, and RX without going through function generators J, H, G, and F. Specifically, long horizontal lines LH0–LH7 and long vertical lines LV0 and LV7 as well as global horizontal lines GH0, GH1 and global vertical lines GV0, GV1 are selectively coupled to tile interconnect lines M0–M23 (FIG. 6). These tile interconnect lines, if coupled to CLB input lines FB, GB, HB and JB, bypass function generators F, G, H and J, respectively, and provide signals (via intermediate multiplexers) to registers RX, RY, RZ, RV, respectively (FIG. 3A). Note that global lines GH0, GH1, GV0, and GV1 are also selectively coupled to registers RX, RY, RZ and RV via register control interconnect structure 307. Allowing all tile interconnect lines M0–M23 to connect to one CLB input line FB, GB, HB or JB and providing connections from every long line to one tile interconnect line M0–M23 (discussed below in connection with FIG. 6) assures that signals on those long and global lines can drive the necessary registers. In the present invention, this PIP pattern also allows signals on all long lines and global lines to drive input lines to function generators F, G, H and J via general input interconnect structure 306.

Output Interconnect Matrix 308

In this embodiment, output lines Q4–Q7 also provide output signals to programmable interconnect matrix 201 (FIG. 2A) via tile interconnect lines M0–M11 or via lines TQ4–TQ7. Output lines Q0–Q3 also provide output signals to selected ones of tile interconnect lines M12–M23. In the embodiment shown in FIG. 3A, output interconnect structure 308 allows signals on each output line Q0–Q7 to drive up to three tile interconnect lines M0–M23. The full pipulation of CLB output interconnect structure 304 allows any output line of CLB 301 to be connected to any tile interconnect line M0–M23. Note that general input interconnect structure 306 also provides selected feedback signals on output lines Q0–Q3 to CLB 301.

Resister Control Interconnect Structure 307

Clock line CLK, clock enable line CE, reset line RST and tristate line TS may be driven by signals provided on selected tile interconnect lines M0–M23 (from programmable routing matrix 201). In addition, for a low skew control, clock line CLK is driven directly by signals on global horizontal lines GH0 and GH1 or from global vertical lines GV0 and GV1.

No Contention

In accordance with the present invention, if one PIP on a predetermined CLB input line is programmed on, then no other PIP on that CLB input line should be turned on. For example, if the PIP at the intersection of input line QW0 and CLB input line F0 is programmed on (i.e. a signal on input line QW0 drives CLB input line F0), then the PIPs on tile interconnect lines M6, M7, M8, M9, M14, M15, and input line QN0 remain turned off, thereby ensuring no contention on CLB input line F0. Typically, contention is avoided either by using a convenient decode method for selecting which PIP on a single input line is turned on or by using rules provided in the software which programs the memory cells to avoid turning on more than one PIP on an input line. In other embodiments, alternative input selection means are possible. For example, in one embodiment one memory cell is loaded to specify whether each PIP is turned on or not.

Programmable Routing Matrix 201

FIG. 6 illustrates the programmable routing matrix 201 of FIG. 2a. Note that whereas all PIPs in CLB matrix 202 are shown as triangles to indicate signal flow onto one line, in FIG. 6, most PIPs in programmable routing matrix 201 are shown as open circles to indicate signal flow on both lines. The exceptions are PIPs which connect lines TQ4 through TQ7 (output lines from tristate buffer block 302 of FIG. 3A) to long horizontal lines LH0–LH7 and long vertical lines LV0–LV7, and PIPs which place signals from global signal lines GH0, GH1, GV0, and GV1 onto tile interconnect lines M0 through M3.

Extending into programmable routing matrix 201 are global lines, long lines, double length lines, and single length lines. Each of these lines is connectable to selected tile interconnect lines M0–M23. Programmable routing matrix 201 provides connection to programmable routing matrices in adjacent tiles through single length lines extending in the four compass directions, i.e. single length north lines N1–N11, single length east lines E1–E11, single length south lines S1–S11, and single length west lines W1–W11. Connection to programmable routing matrices one tile away are provided by double length north lines DN0 and DN6, double length east lines DE0 and DE6, double length south lines DS0 and DS6, and double length west lines DW0 and DW6 (see FIG. 2A). Each long vertical line LV0–LV7 and long horizontal line LH0–LH7 which extends through the tile is connectable to one of tile interconnect lines M0–M23.

The particular pattern of PIPs illustrated in FIG. 6 is sparse, yet provides significant signal transferability. Specifically, programmable routing matrix 201, which in this embodiment includes only 124 PIPs, is sparse relative to the approximately 4200 PIPs which could be provided to connect every line in FIG. 6 to every other line. However, the PIP pattern ensures that any line is connectable to any other line if enough intermediate PIPs are used. For example, as shown in FIG. 6, west line W1 is connectable to east line E1 by turning on two PIPs which connect tile interconnect line M1 to these two lines. In contrast, to make a connection between west line W1 and east line E2 requires 8 PIPs and 9 lines, i.e. connecting west line W1 to tile interconnect line M1 to east line E1 to tile interconnect line M20 to west line W9 to tile interconnect line M9 to north line N9 to tile interconnect line M21, and finally to east line E2. Although a path of this length is typically undesirable, in some applications delay is unimportant. In those applications, the availability of such a path allows completion of a design. Easy paths requiring only two PIPs are available to connect lines N1, S1, E1, and W1 to tile interconnect line M1; lines N2, S2, E2, and W2 to tile interconnect line M2 and so forth through tile interconnect line M5. Tile interconnect line M6 connects to double length lines DN6, DS6, DE6, and DW6. Tile interconnect lines M7 through M11 connect to correspondingly numbered single length lines extending north, south, east and west.

PIPs on tile interconnect lines M12–M23 implement a pattern of cross connecting that facilitates signal transfer flexibility with minimal sacrifice of speed, and the sparse pipulation achieves valuable reduction of chip area. For example, tile interconnect line M12 connects to double length north line DN0, to south line S3, to east line E5, and to west line W1, whereas tile interconnect line M15 connects to north line N3, east line E8, double south line DS6, and west line W4. In this manner, the present invention provides a predetermined pattern to minimize the number of PIPs, thereby allowing any line to be connected to any other line. Thus, the present invention ensures that a path is always provided, while minimizing silicon area.

Routing Matrix Model

Figure 7A:
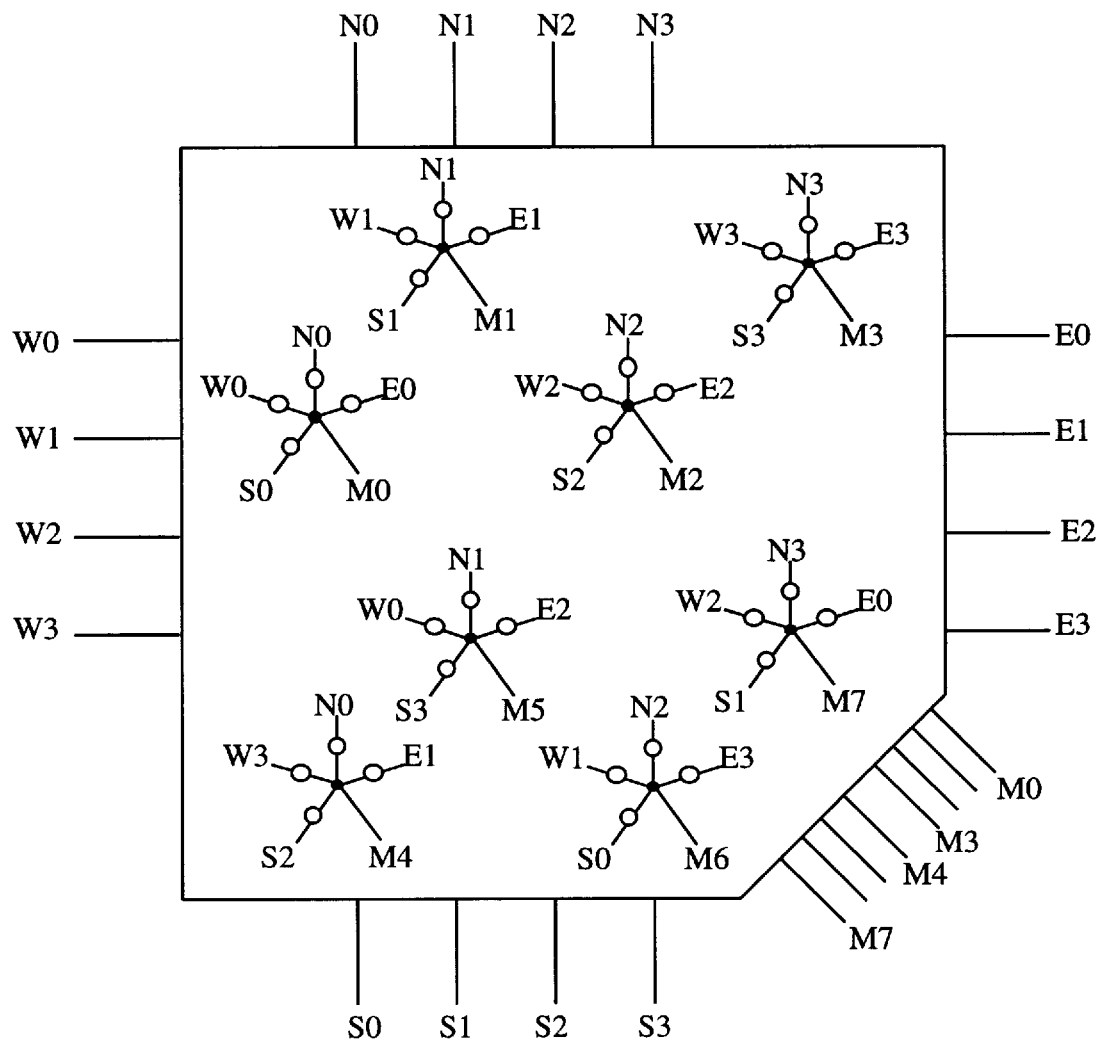
FIG. 7A illustrates an example of the connectivity achieved by a programmable routing matrix of the invention such as shown in FIG. 6.

Each of tile interconnect lines M0–M23 is connectable to five or six other lines. Thus, as shown in FIG. 7A, each tile interconnect line M0–M23 is represented as a star with five or six points. In this model, eight tile interconnect lines M0 through M7 are programmably connectable to selected ones of north lines N0–N3, east lines E0–E3, south lines S0–S3 and west lines W0–W3. Tile interconnect lines M0 through M3 are connectable to north, south, east and west lines of the same numerical suffix. Tile interconnect lines M4 through M7 are connectable to staggered ones of the north, south, east and west lines. Thus, tile interconnect lines M0–M3 provide a means for interconnecting north, east, south and west lines of the same suffix, while tile interconnect lines M4–M7 provide an opportunity for cross-connecting lines from four compass directions. Also, tile interconnect lines M0–M7 provide means for connecting programmable routing matrix 201 to configurable logic block matrix structure 202 (FIG. 3A).

Connectivity Model for Routing Matrix and Logic Blocks

Figure 7B:
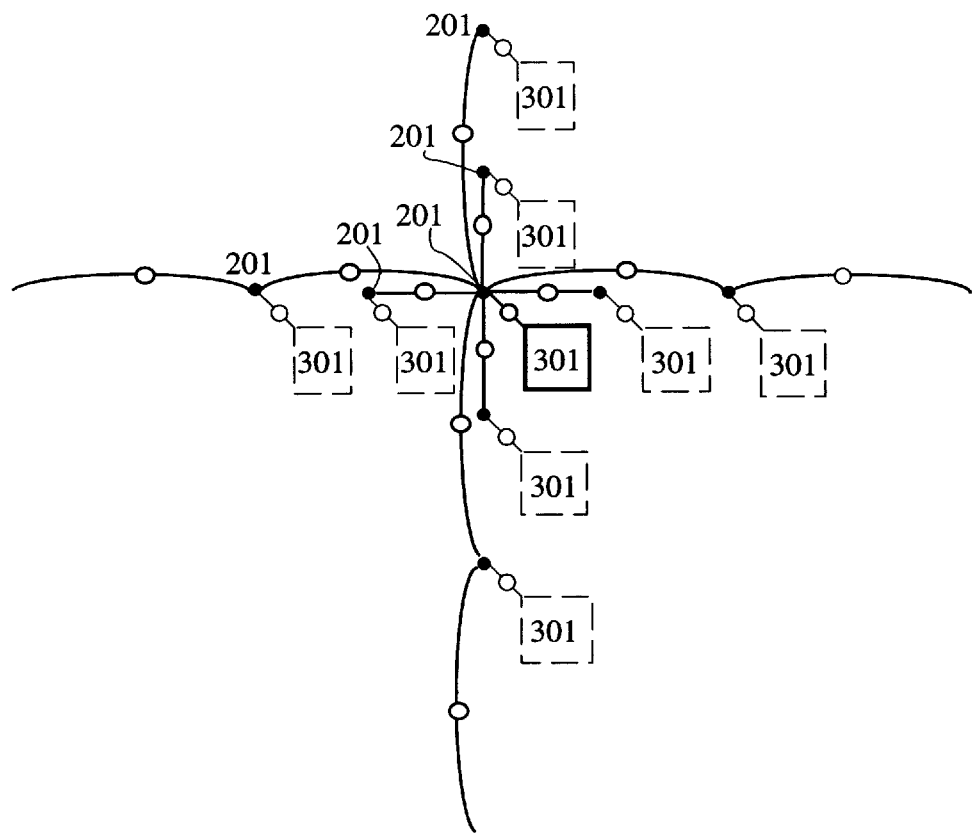
FIG. 7B illustrates an example of the connectivity achieved by the combination of the programmable routing matrix of FIG. 6 and the tile structure of FIG. 2A or 2B.

FIG. 7B illustrates the "star structure" of the present invention. In a star structure, each CLB 301 is associated with a particular star 201 (i.e. the programmable routing matrix 201) from which radiate lines connecting to other stars 201 and from there to other CLBs 301. In FIG. 7B, double length and single length lines are illustrated. In other embodiments, lines of other lengths are provided in the star structure. Thus, the star structure of the present invention ensures good connectivity between its related CLBs and other parts of the device.

Global Interconnect Structure

Figure 8:
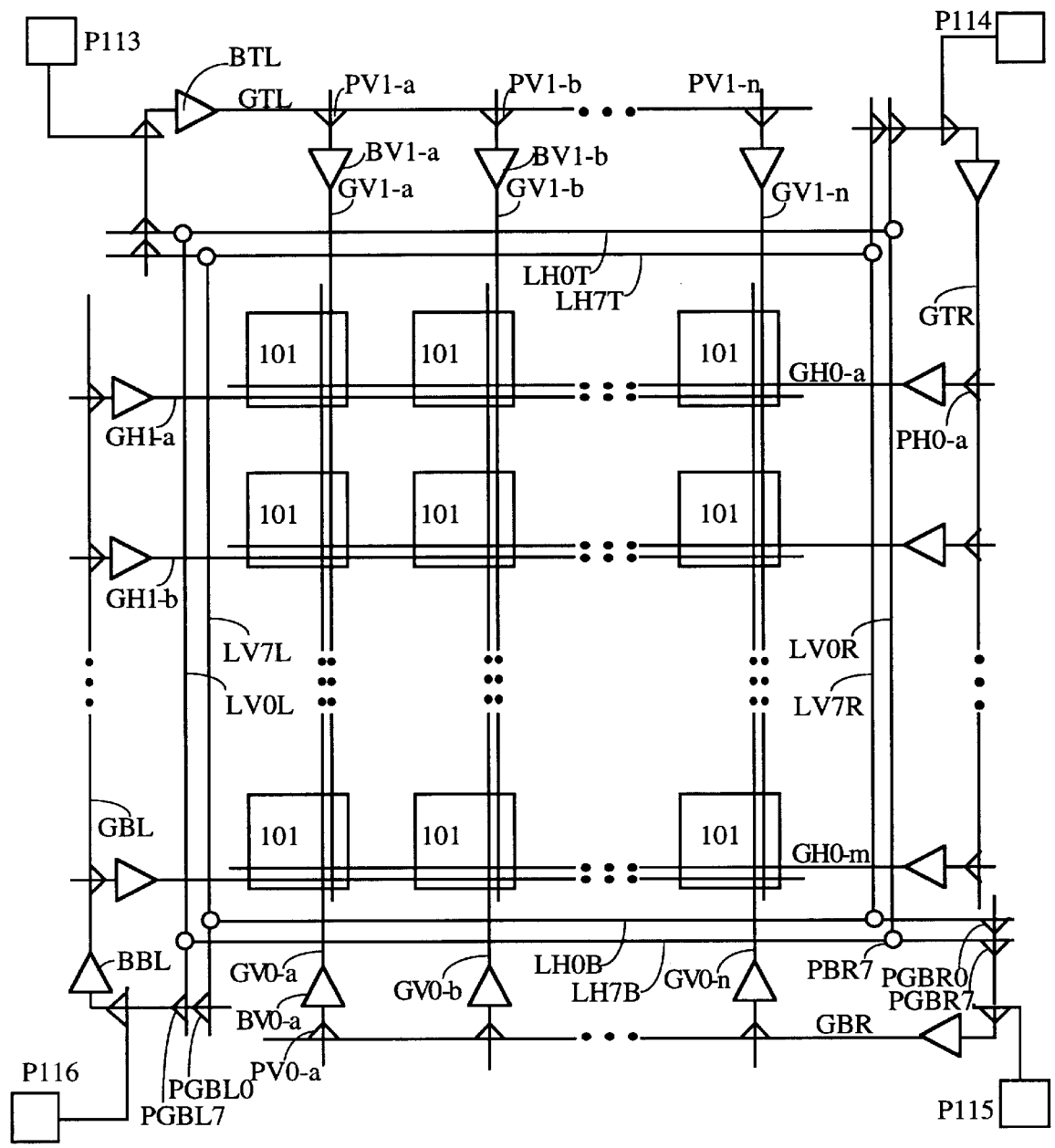
FIG. 8 illustrates connections from global signal pads near corners of a chip to global signal lines which extend near four edges of the chip and connect to global lines which drive core tiles.

FIG. 8 illustrates hard connections from global signal pads P113, P114, P115, and P116, which are positioned near the corners of chip 100 (FIG. 1), to global signal lines GTL, GTR, GBR, and GBL, respectively, which are typically located near the four edges of chip 100. Each global signal line is programmably connectable to a plurality of lines extending vertically or horizontally through each row or column of core tiles 101. For example, top left global signal line GTL is connectable to global vertical lines GV1-$a$ through GV1-$n$, via PIPs PV1-$a$ through PV1-$n$, respectively, i.e. one PIP for each column of core tiles 101. Top right global signal line GTR is connectable via PIPs PH0-$a$ through PH0-$m$, respectively, i.e. one PIP for each row of core tiles 101 to global horizontal lines GH0-$a$. Bottom right global signal line GBR is connectable to global vertical lines GV0-$a$ through GV0-$n$. Finally, bottom left global signal line GBL is connectable to global horizontal lines GH1-$a$ through GH1-$m$. Note that the global vertical and horizontal lines with reference labels beginning with GV or GH are connectable to programmable routing matrices 201 and CLB matrices 202 in core tiles 101 through which the global lines pass, as discussed above in connection with FIGS. 2A, 3, and 7.

As also shown in FIG. 8, long lines LV0L, LV7L, LH0T, LH7T, LV0R, LV7R, LH0B, and LH7B which extend through the edge tiles (not shown in FIG. 8 for simplicity but shown in FIGS. 10A through 10D) of chip 100 (FIG. 1) are also connectable to the global lines. Specifically, bottom right global signal line GBR can be driven by signals on bottom horizontal long lines LH0B and LH7B via PIPs PGBR0 and PGBR7, respectively. Bottom left global signal line GBL can be driven by signals on left vertical long lines LV0L and LV7L via bottom left buffer BBL via PIPs PGBL0 and PGBL7, respectively. Equivalent connections are provided for the top and right edges of the chip. Left, top, right, and bottom long lines are connectable to each other through PIPs, such as PIP PBR7. Because long lines LV0L, LV7L, etc. are driven by signals provided by any of the pads at the perimeter of the chip (through edge tiles 103–106 discussed below in connection with FIGS. 10A–10D), any pad can provide a global signal. Moreover, any of core tiles 101 can also provide a global signal through edge tiles 103–106.

Optional Long Line Splitter

Figure 9:
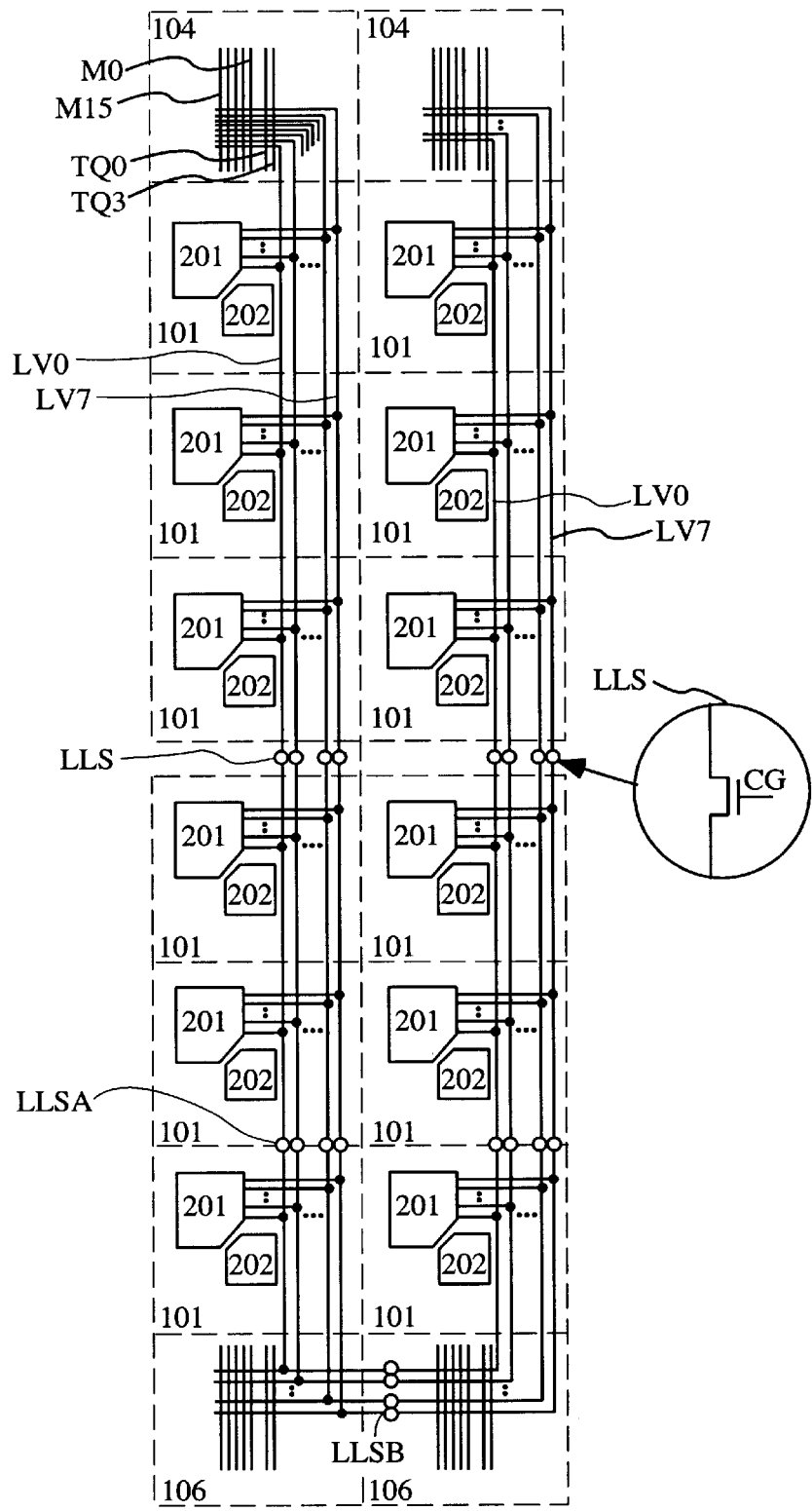
FIG. 9 illustrates long line splitters which are provided on long lines in one embodiment of the invention.

FIGS. 1 and 9 illustrate one embodiment of the present invention which includes long line splitters LLS which may be positioned partly through a line. Two columns of tiles are illustrated in FIG. 9, each column comprising a top edge tile 104, six core tiles 101, and a bottom edge tile 106. Long vertical lines LV0–LV7 traverse all core tiles 101, and in each of the two columns terminate in edge tiles 104 and 106. Long vertical lines LV0–LV7 are also connectable to selected ones of tile interconnect lines M0–M15 and lines TQ0–TQ3 in edge tiles 104 and 106, as will be discussed below in connection with FIGS. 10A–10D. Furthermore, as discussed above in connection with FIGS. 2A and 6, long lines LV0–LV7 are connectable to selected lines in programmable routing matrices 201. For clarity, horizontal long lines LH0–LH7 are not illustrated in FIG. 9, but are illustrated in FIGS. 2A and 6.

In the embodiment shown in FIG. 9, vertical long lines LV0–LV7 in the three upper core tiles 101 are separated from the portions in the three lower core tiles 101 by long line splitters LLS. An inset illustrates that a long splitter LLS in one embodiment comprises an n-type transistor which is turned off by providing a low voltage to a control gate CG, thereby separating the vertical long line into top and bottom segments. Long line splitters LLS are typically used in large chip embodiments to allow top and bottom long lines to be separately driven in different portions of the chip. As shown in FIG. 1, horizontal long lines LH0–LH7 are also separated in the middle of chip 100 by long line splitters LLS. In other embodiments, several long line splitters such as long line splitters LLS and LLSA are provided along the same long line, or long line splitters LLSB are provided between an end of a long lines in one edge tile and an end of a long line in an adjacent edge tile, thereby programmably connecting these long lines.

Edge Tiles for Embodiment of FIG. 2A

FIGS. 10A–10D illustrate in greater detail the edge tiles shown in FIG. 2A. Specifically, FIGS. 10A–10D show left edge tile 103, top edge tile 104, right edge tile 105, and bottom edge tile 106, respectively. Each edge tile in these embodiments is typically but not always connected to at least one of pads PV, PZ, PY or PX. In other embodiments described in detail below in reference to FIG. 1, at least one edge tile is not connected to any pad.

In FIG. 10A, four pads, PV, PZ, PY, and PX are connected to edge tile 103 via input/output (I/O) devices IOBV, IOBZ, IOBY and IOBX, respectively. Each of I/O devices IOBV, IOBZ, IOBY and IOBX is connected to edge tile 103 by three lines. For example, I/O device IOBV is connected to edge tile 106 by an I/O input line IV, an I/O output line OV, and a tri-state line TSV. Note that the output signal provided to pad P42 by output line OV is controlled by a signal on I/O tri-state line TSV. Similar lines are provided for I/O devices IOBZ, IOBY and IOBX.

A fully pipulated I/O input interconnect structure 1001 allows signals on I/O input lines IV, IZ, IY, and IX to drive edge tile input lines QIN0–QIN3. Neighbor output interconnect structure 1004 allows signals on output lines QE0–QE3 from a core tile 101 to be provided to pads PV, PZ, PY and PX. I/O output interconnect structure 1002 allows signals from the neighboring core tiles (in edge tile 103, provided by north lines N0–N7, south lines S0–S7, and east lines E1–E5 and E7–E11) as well as signals on long lines LH0–LH7 and LV0–LV7 and double length lines DH0, DH6, to be provided to the pads. Note that I/O output interconnect structure 1002 has a substantially complete pipulation, thereby allowing any signal coming into left edge tile 103 from elsewhere in the chip interior to be placed on any of pads PV, PX, PY or PZ in spite of a sparse general interconnect structure 1006 between lines coming from other parts of the chip interior into or out of left edge tile 103 and a set of edge tile interconnect lines M0–M15.

Intermediate interconnect structure 1003 allows signals which come from one of tile interconnect lines M0–M15 to be placed on one of edge tile input lines QIN0–QIN3, buffered onto a corresponding output line Q0 through Q3, and provided through tristate buffer block 302 to a corresponding line TQ0–TQ3. A signal can thence be provided to horizontal long lines LH0–LH7 and vertical long lines LV0–LV7. Thus, signals on edge tile input lines QIN0–QIN3 drive output lines Q0–Q3 directly and drive lines TQ0–TQ3 through tri-state buffer block 302.

Feedback interconnect structure 1005 allows signals on output lines Q0–Q3 to drive tile interconnect lines M0–M15 which are in turn selectively connected to north lines N0–N7, south lines S0–S7, east lines E1–E11, double length lines DE0, DE6, DH0, and DH6 and to long lines LV0–LV7. In this manner edge tile 103 allows connection to pads which in turn have external connections to chip 100, as well as on an adjacent core tile 101 chip and to adjacent edge tiles (or an adjacent corner tile, explained in detail below). Pads PV, PZ, PY, and PX represent pads P42, 41, 40 and P39, respectively, which are shown in FIG. 1.

FIGS. 10B, 10C, and 10D show embodiments of edge tiles 104, 105, and 106, respectively. Because these tiles are similar in structure, except for orientation, and have identical numerical references to that shown in FIG. 10A, the detail of the interface structures in FIGS. 10B, 10C, and 10D will not be discussed herein.

I/O Interface for Use With Optional Pad

FIG. 10C illustrates a combination of connected and unconnected pads, thereby illustrating the flexibility available at the mask level. This configuration is more fully discussed in concurrently filed co-pending U.S. patent application Ser. No. 08/221,679 by Danesh Tavana entitled I/O INTERFACE CELL FOR USE WITH OPTIONAL PAD, [docket no. M-2260], incorporated herein by reference.

In this embodiment, one unconnected pad PZ and connected pads PV, PY, PX implement a configuration which is represented in FIG. 1 by pads P6, P7 and P8 (connected to edge tile 105). As shown in FIG. 1, each edge tile has a predetermined number of pads connected to it. For example, pad P17 is the only pad connected to its edge tile 106. Therefore, as shown in FIG. 10D, only one of pads PV, PZ, PY and PX (in this embodiment, pad PV) is connected to edge tile 106.

Referring back to FIG. 10C, pad PZ and its input/output buffer structure IOBZ are eliminated, thereby reducing total chip size by reducing the total number of pads on the chip. Input line IZ and output line OZ are shorted together in a region which in one embodiment is outside tile 105. In this manner, all tiles 105 are identically laid out, regardless of how many pads PV, PZ, PY, or PX are provided. Referring back to FIG. 1, pads P6, P7 and P8 are connected to a single edge tile 105. In FIG. 10D, pad PY and related structures IOBY and ESDY are not provided. Thus, the embodiment of FIG. 10D represents pads P26 through P28 of FIG. 1. In other embodiments of the present invention, other pads are removed, up to and including removal of all four pads. For example, FIG. 1 includes certain edge tiles to which no pads have been connected (two of edge tiles 103, one of edge tiles 104, and one of edge tiles 105 have no pads at all connected to them).

Corner Tiles

Figure 11A:
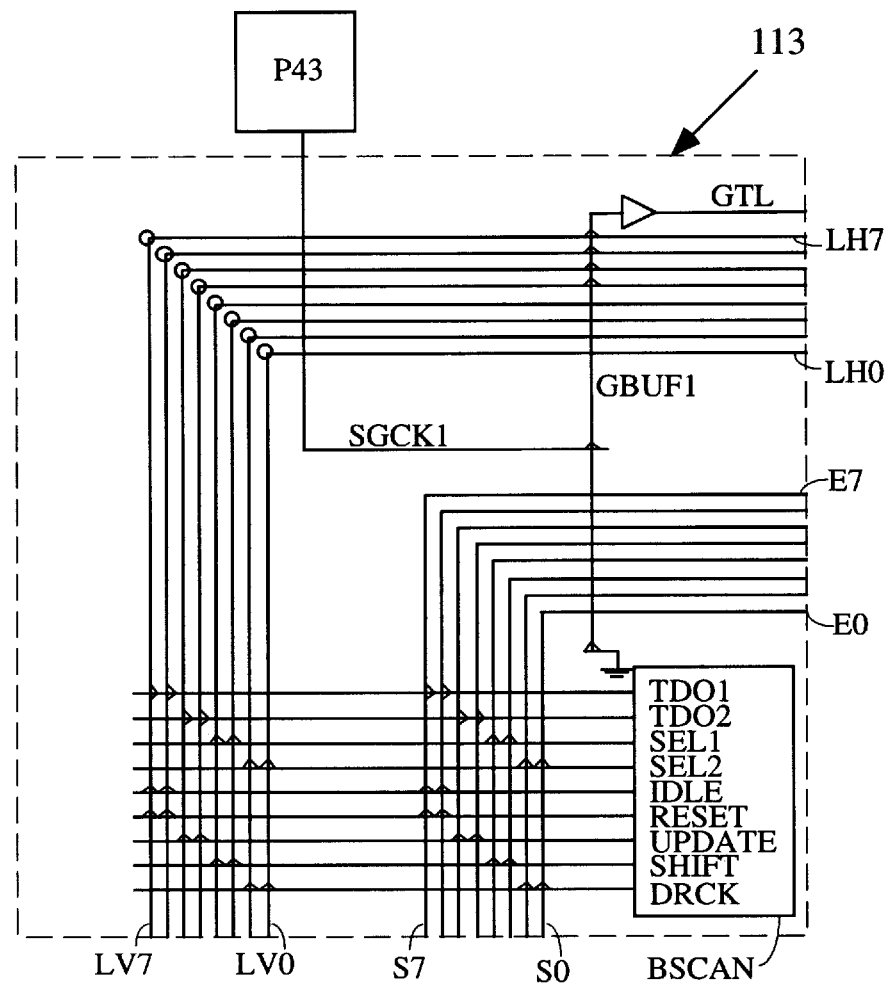
FIGS. 11A–11D illustrate upper left, upper right, lower right, and lower left corner tiles for the same embodiment.

FIGS. 11A through 11D illustrate the four corner tiles 113, 114, 115, and 116, respectively, of chip 100 (FIG. 1). FIG. 11A includes a conventional boundary scan block BSCAN compatible with IEEE 1149.1 described in detail in a Xilinx Application Note by Luis Morales entitled, "Boundary Scan in XC4000 Devices" and available from Xilinx, Inc., 2100 Logic Drive, San Jose, Calif. 95124, which is herein incorporated by reference in its entirety. In FIG. 11A, top left corner tile 113 includes hard connections from single length east lines E0–E7 to single length south lines S0–S7, respectively, and programmable connections from long horizontal lines LH0–LH7 to long vertical lines LV0–LV7, respectively. FIG. 11A further shows one embodiment of an interconnect structure 1101 which provides the programmable connection of boundary scan block BSCAN to the above-described single length and long lines. Corner tile 113 also includes a programmable connection to an external pin P43 that provides a global clock signal SGCK1.

Figure 11B:
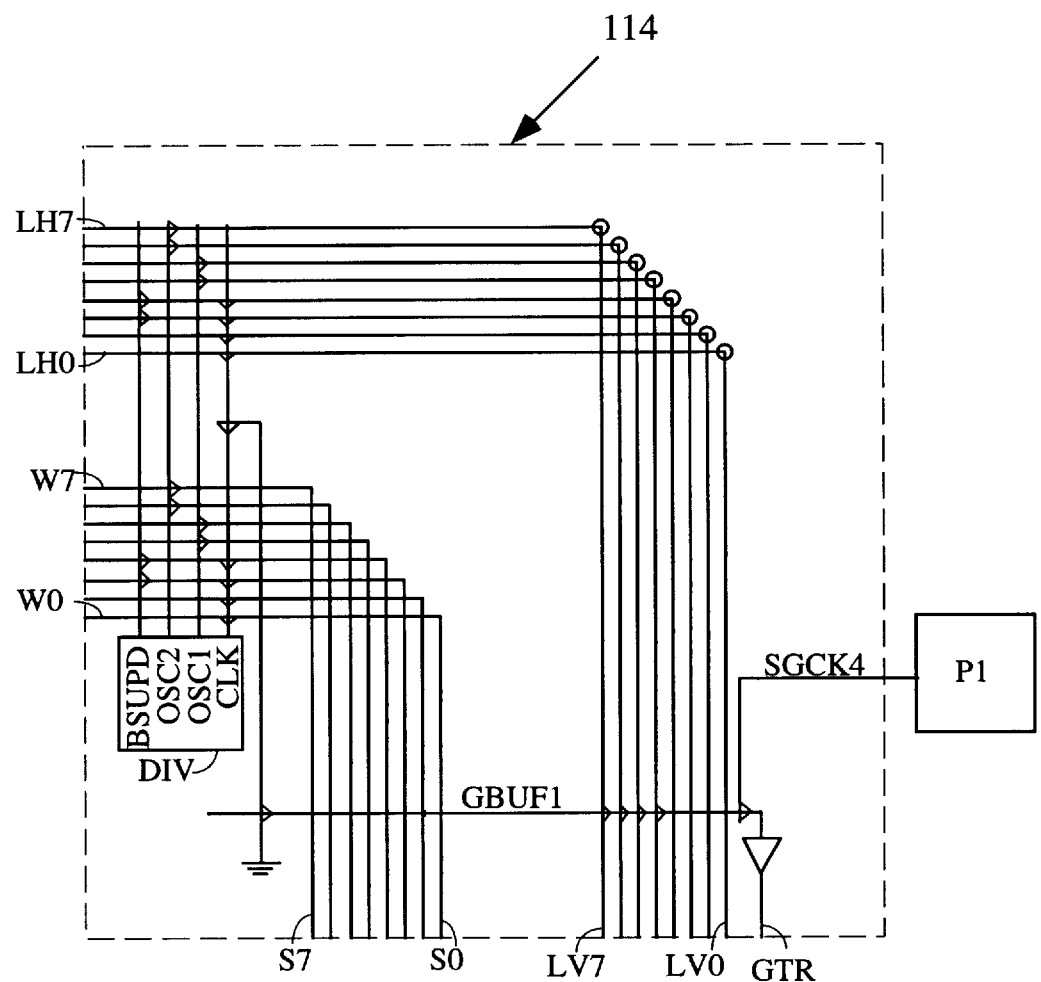

Corner tile 114, illustrated in FIG. 11B, is similar in configuration to corner tile 113 (FIG. 11A). Specifically, tile 114 (FIG. 11B) includes hard connections for connecting single length west lines W0–W7 to single length south lines S0–S7, respectively, and programmable connections for connecting long horizontal lines LH0–LH7 to long vertical lines LV0–LV7, respectively. In both FIGS. 11A and 11B, long vertical line LV0 connects to long horizontal line LH0, but because of the layout of tiles 113 and 114, the lines are drawn in a different position on the page, and therefore corner tiles 113 and 114 have a different appearance in FIGS. 11A and 11B. Corner tile 114 includes a clock input pin P1 that provides clock signal SGCK4. Corner tile 114 includes an interconnect structure 1102 which provides a programmable connection between a conventional oscillator/counter circuit DIV used for counting bits during configuration of chip 100 and the above-described single length and long lines. In one embodiment, circuit DIV is used during chip operation to provide an on-chip oscillator or a counter-divider. Circuit DIV is typically configured to divide an internal oscillator signal or a user-provided signal. Corner tile 114 further includes a boundary scan update signal BSUPD, which is part of the standard boundary scan circuitry (most of the circuitry being located in tile 113). In this embodiment, signal BSUPD is programmably placed on west lines W2 and W3 (and thus south lines S2 and S3) as well as long horizontal lines LH2 and LH3 (and thus long vertical lines LV2 and LV3).

Figure 12:
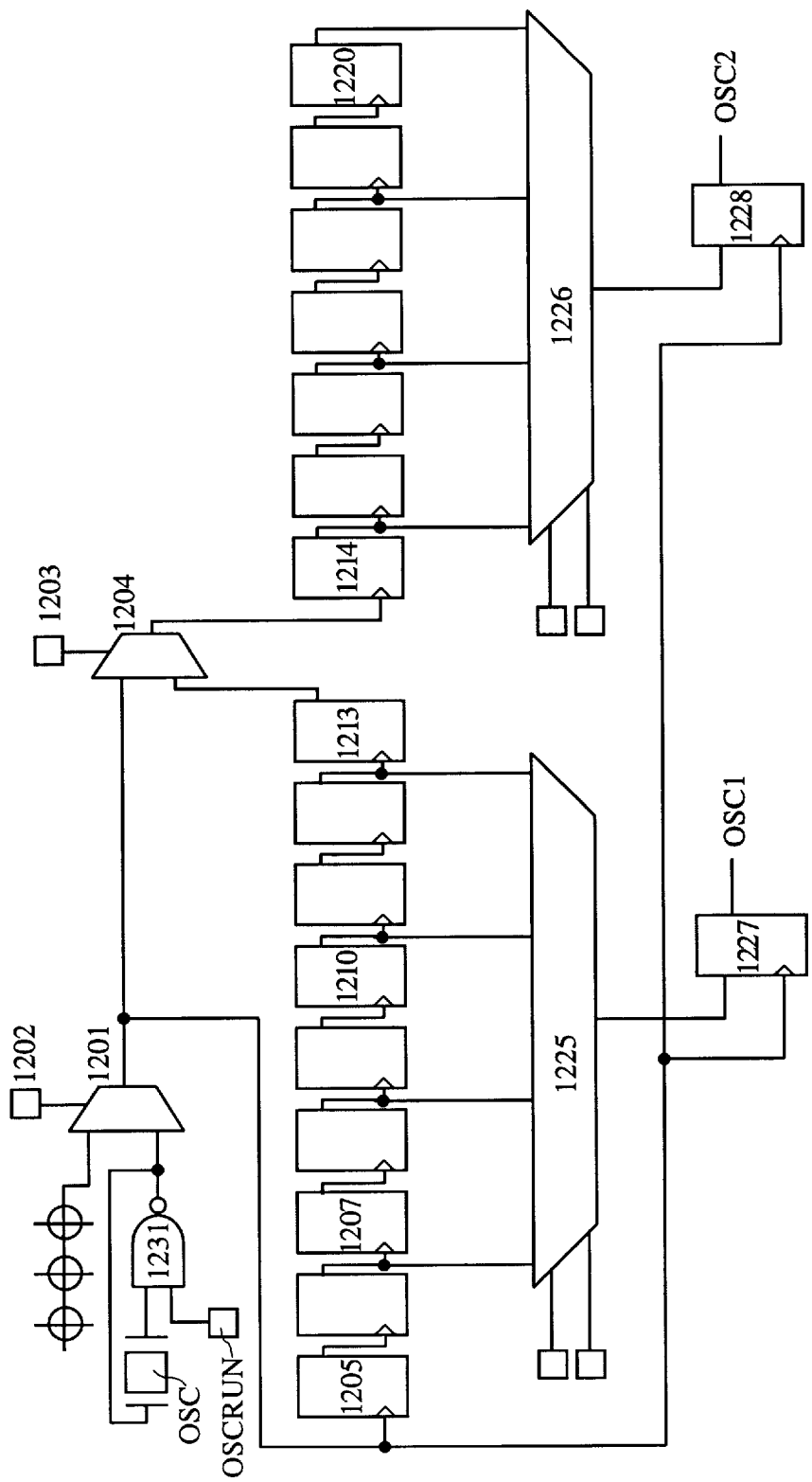
FIG. 12 illustrated a logic diagram for one embodiment of the oscillator structure used in FIG. 11B.

FIG. 12 illustrates one embodiment of a circuit which implements oscillator/counter circuit DIV of FIG. 11B. Two output taps, OSC1 and OSC2 are provided, which together can be configured to provide twelve frequencies which are divisions of the original input frequency. An internal oscillator OSC provides an oscillator signal to NAND gate 1231. NAND gate 1231 is enabled by a memory cell OSCRUN. When enabled, the output signal from oscillator OSC is provided to multiplexer 1201.

Memory cell 1202 determines whether multiplexer 1201 provides the output signal from internal oscillator OSC or a signal on one of single length west lines W0–W3 (equal to a signal on single length south lines S0–S3, respectively, see FIG. 11B), or a signal on one of long horizontal lines LH0–LH3 (equal to a signal on long vertical lines LV0–LV3). Multiplexer 1201 provides an output signal which is then available to be divided by flip flops 1214 through 1220.

Multiplexers 1225 and 1226 provide a choice of divide factors on the data input terminals of flip flops 1227 and 1228 respectively. The outputs of these flip flops are provided as signals on taps OSC1 and OSC2. Flip flops 1227 and 1228 are clocked from the original input signal and serve to reduce the skew of the output signals from multiplexers 1225 and 1226. Multiplexer 1225, under control of memory cells OSC1A and OSC1B, provides a switching signal which can be the input signal from multiplexer 1201 divided by 4, 16, 64, or 256. Depending upon the setting in memory cell 1203, multiplexer 1204 can forward the original clock signal output from multiplexer 1201 or can provide a divided signal (the original frequency divided by 512) which is output from flip flop 1213. If multiplexer 1204 is set to provide the output signal of multiplexer 1201, then the original clock signal is alternatively provided by multiplexer 1226 as divided by 2, 8, 32, or 128. If multiplexer 1204 is set to provide a divided signal from flip flop 1213, multiplexer 1226 will provide an output signal which has the frequency of the original input signal on multiplexer 1201 divided by 1024, 4096, 16,384, or 65,536. Thus, the signals on output taps OSC1 and OSC2 are programmed to oscillate at many different choices of frequency.

Figure 11C:
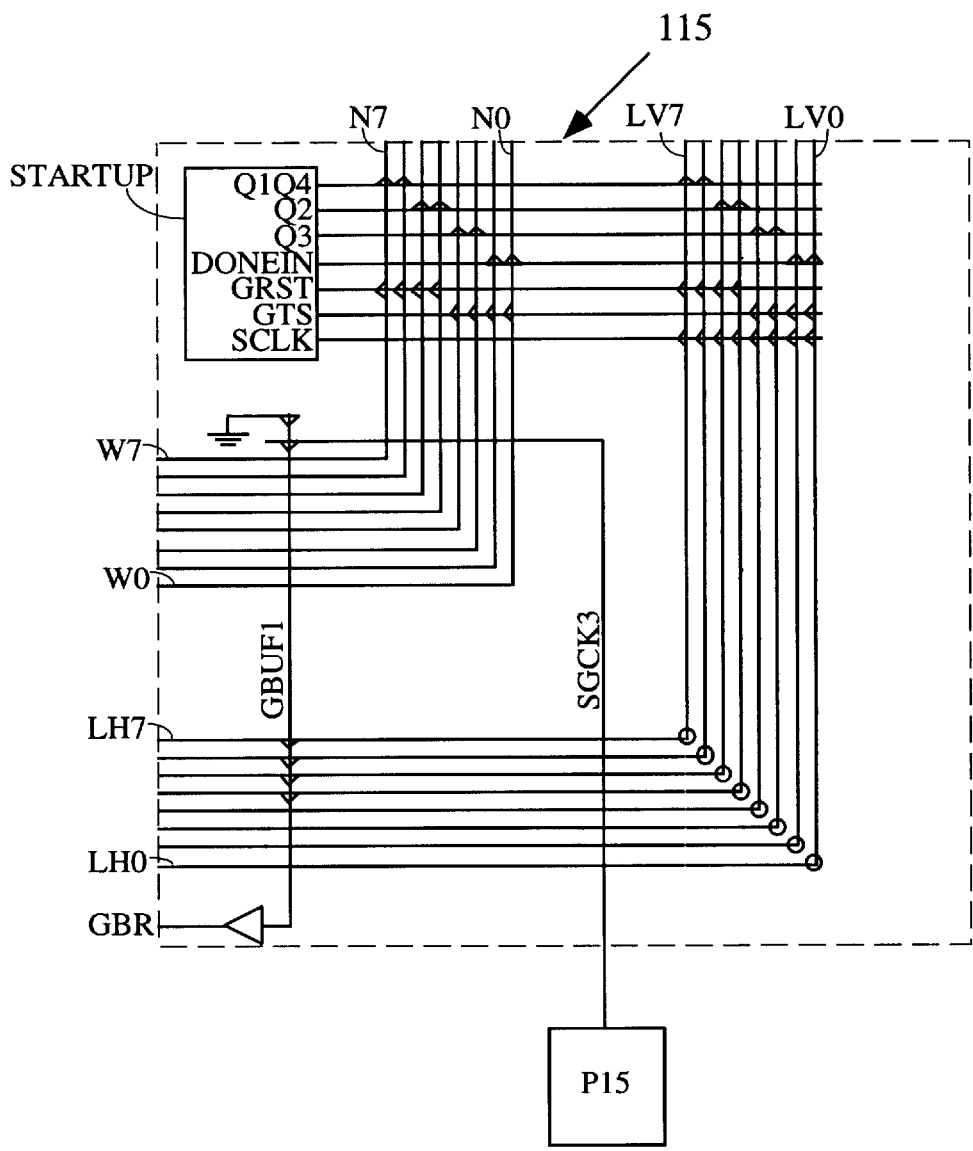

FIG. 11C shows lower right corner tile 115. Corner tile 115 programmably connects long horizontal lines LH0–LH7 and long vertical lines LV0–LV7, respectively, and connects north lines N0–N7 to west lines W0–W7. Corner tile 115 further includes a programmable interconnect structure 1103 which programmably connects a start-up block STARTUP to north lines N0–N7 (and thus west lines W0–W7) and long vertical lines LV0–LV7 (and thus long horizontal lines LH0–LH7). Start-up block STARTUP includes circuitry to sequence the signals and control timing of the start-up function as chip 100 (FIG. 1) is activated.

During the start-up function, three events are necessary to move from configuration mode to operating mode: release of the signal on a global tri-state signal terminal GTS, release of the signal on a global reset signal terminal GSR, and release of a signal on a load complete terminal DONE (indicating that all configuration bits have been loaded into their appropriate locations in the FPGA). The start-up block STARTUP allows the user to program the order in which these signals are released, as well as the timing of these signals (for example separating each signal from another signal by one, two, or three clock cycles).

Figure 11D:
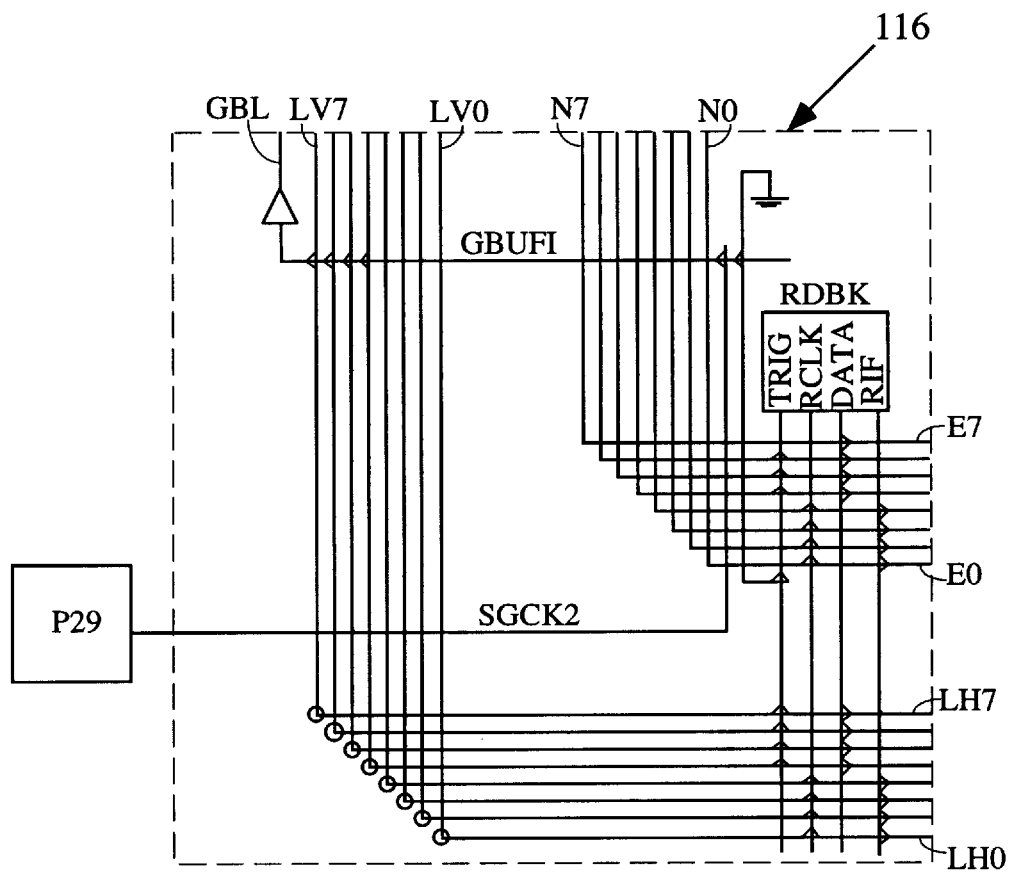

FIG. 11D shows lower left tile 116 with single length and long lines connected similarly to the other three corner tiles. In addition, lower left corner tile 116 includes a read-back unit RDBK. Read-back unit RDBK allows the user to read the content of the configuration memory onto any data line and out into any external pin through the data line terminal DATA of readback unit RDBK. The trigger terminal TRIG in read-back unit RDBK carries a signal that triggers copying of one row of configuration data from the configuration memory into the same shift register which loaded the configuration memory. The signal on a clock terminal CLK controls shifting out of that data onto line DATA. The signal on a read-in-progress terminal RIP prevents the chip from sending another signal from trigger terminal TRIG while data are still being shifted out. With this circuit, depending on the original configuration paths to corner tile 116, the configuration data for the entire chip is shifted out of the chip onto almost any one of the external pins while the chip is operating.

In light of the above description, many other embodiments of the present invention will be apparent to those skilled in the art. For example, although the above description relates to an embodiment in which core tiles are rectangular or square, another embodiment of the present invention includes tiles having six sides.

As mentioned above, core tiles need not be identical. A set of tile designs may be provided which have different logic content from each other. If all tile designs follow common boundary constraints, chips can be formed by combining the tile designs in a variety of patterns. To be successful, each tile design must have a good distribution of signals within the tile. The routing matrix of the tile must efficiently distribute the incoming signals to the logic block input terminals and take the logic block output signals to the tile edges. Indeed a chip may be composed in which some tiles include RAM memory and no logic, or a combination of tiles having logic, tiles having memory only, and tiles having routing with no logic or memory. Further, a tile may be designed which includes an input/output pad physically within its structure, and tile designs including a pad may be combined with other tile designs to achieve distributed access to logic. Such other embodiments are intended to fall within the scope of the present invention. The present invention is set forth in the claims.

We claim:

1. An interconnect structure comprising:
    a plurality of signal lines;
    a first plurality of transistors, each transistor provided on one signal line;
    at least one memory device for controlling the state of said plurality of transistors;
    a second plurality of transistors, each transistor coupled to a subset of said first plurality of transistors; and
    a decoder for controlling the states of said second plurality of transistors, wherein said decoder determines which of said second plurality of transistors provides a signal on an output line.

2. The interconnect structure of claim 1 further comprising a third plurality of transistors coupled in series to one subset of said first plurality transistors.

3. The interconnect structure of claim 2 wherein said at least one memory device includes a plurality of memory devices, and wherein each memory device controls the state of one of said third plurality of transistors.

4. The interconnect structure of claim 3 wherein said plurality of memory devices provide a signal to said first plurality of transistors and the complement of said signal to said third plurality of transistors.

5. An interconnect structure comprising:

a plurality of lines;

a first plurality of transistors, each transistor provided on one signal line;

a first memory device for controlling the state of said first plurality of transistors, wherein said means for controlling provides a signal to a first group of said first plurality of transistors and provides the complement of said signal to a second group of said first plurality of transistors;

a second plurality of transistors, each transistor coupled to a subset of said first plurality of transistors;

a second memory device for controlling the state of said second plurality of transistors, wherein said means for controlling provides a signal to a first group of said second plurality of transistors and provides the complement of said signal to a second group of said second plurality of transistors;

a third plurality transistors, each transistor coupled to a subset of said second plurality of transistors;

a third memory device for controlling the state of said third plurality of transistors, wherein said means for controlling provides a signal to a first group of said third plurality of transistors and provides the complement of said signal to a second group of said third plurality of transistors, wherein one of said third plurality of transistors provides a signal on an output line.

* * * * *